(12) United States Patent
Yamauchi

(10) Patent No.: US 12,094,747 B2
(45) Date of Patent: Sep. 17, 2024

(54) SUBSTRATE BONDING DEVICE

(71) Applicant: BONDTECH CO., LTD., Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 880 days.

(21) Appl. No.: 17/261,022

(22) PCT Filed: Jul. 2, 2019

(86) PCT No.: PCT/JP2019/026226
§ 371 (c)(1),
(2) Date: Jan. 17, 2021

(87) PCT Pub. No.: WO2020/017314
PCT Pub. Date: Jan. 23, 2020

(65) Prior Publication Data
US 2021/0320024 A1 Oct. 14, 2021

(30) Foreign Application Priority Data
Jul. 19, 2018 (JP) .................. 2018-135801

(51) Int. Cl.
*H01L 21/683* (2006.01)
*H01L 21/67* (2006.01)
(Continued)

(52) U.S. Cl.
CPC ........ *H01L 21/6833* (2013.01); *H01L 21/681* (2013.01); *H01L 21/67092* (2013.01); *H01L 23/544* (2013.01); *H01L 2223/54426* (2013.01)

(58) Field of Classification Search
CPC .......................... H01L 21/6833; H01L 21/681
See application file for complete search history.

(56) References Cited

U.S. PATENT DOCUMENTS

2002/0176219 A1   11/2002   Sakaue et al.
2003/0178468 A1    9/2003   Lee et al.
(Continued)

FOREIGN PATENT DOCUMENTS

JP   2974303 B        11/1999
JP   2001077186 A  *   3/2001
(Continued)

OTHER PUBLICATIONS

Machine translation WO2016060274A1 (Year: 2016).*
(Continued)

*Primary Examiner* — Jacob T Minskey
*Assistant Examiner* — Wayne K. Swier
(74) *Attorney, Agent, or Firm* — ASLAN LAW, P.C.

(57) ABSTRACT

This substrate bonding device (100) includes: a stage (401), a head (402), an electrostatic chuck that holds a peripheral portion of a substrate (301) while the stage (401) supports the substrate (301), a holder driver that drives the electrostatic chuck, and a controller (700). The electrostatic chuck is disposed in a first area on the stage (401) facing the peripheral portion of the substrate (301), and the holder driver drives the electrostatic chuck by applying voltage to the electrostatic chuck. The controller (700) controls the holder driver in such a manner that a peripheral portion of the substrate (301) is released from the electrostatic chuck when a peripheral portion of the substrate (301) is made to come into contact with a peripheral portion of the substrate (302) while a central portion of a bonding surface of the substrate (301) and a central portion of a bonding surface of the substrate (302) are in contact with each other.

4 Claims, 35 Drawing Sheets

(51) Int. Cl.
*H01L 21/68* (2006.01)
*H01L 23/544* (2006.01)

(56) References Cited

U.S. PATENT DOCUMENTS

| | | | |
|---|---|---|---|
| 2004/0114124 | A1 | 6/2004 | Hoeks et al. |
| 2005/0092816 | A1* | 5/2005 | Lee .................. H01L 21/6831 |
| | | | 361/234 |
| 2008/0245843 | A1 | 10/2008 | Suga et al. |
| 2010/0267317 | A1 | 10/2010 | Takahashi et al. |
| 2013/0251494 | A1 | 9/2013 | Okamoto |
| 2014/0072774 | A1 | 3/2014 | Kito et al. |
| 2014/0208556 | A1 | 7/2014 | Sugihara et al. |
| 2014/0209230 | A1 | 7/2014 | Wagenleitner |
| 2014/0261960 | A1* | 9/2014 | Lin .................... H01L 21/02 |
| | | | 156/286 |
| 2016/0358802 | A1 | 12/2016 | Moslehi et al. |
| 2017/0221856 | A1 | 8/2017 | Yamauchi |
| 2018/0047699 | A1 | 2/2018 | Omori et al. |
| 2021/0090879 | A1* | 3/2021 | Yamazaki ......... H01L 21/02041 |

FOREIGN PATENT DOCUMENTS

| | | | |
|---|---|---|---|
| JP | 2003037159 A | 2/2003 | |
| JP | 2003315759 A | 11/2003 | |
| JP | 2004104114 A | 4/2004 | |
| JP | 3758979 B | 3/2006 | |
| JP | 2010-153585 A | 7/2010 | |
| JP | 2014165453 A | 9/2014 | |
| WO | WO2013023708 A1 | 2/2013 | |
| WO | WO-2016060274 A1 * | 4/2016 | ........... B23K 20/023 |
| WO | WO2017155002 A1 | 9/2017 | |
| WO | WO 2018/062467 A1 | 4/2018 | |
| WO | WO2018065861 A1 | 4/2018 | |

OTHER PUBLICATIONS

Merriam-Webster Dictionary definitions for transparent and translucent: https://www.merriam-webster.com/dictionary/translucent#:~:text=transparent%20implies%20being%20so%20clear, translucent%20frosted%20glass. (Year: 2009).*
Machine translation JP2001077186A (Year: 2001).*
Machine translation WO2018065861A1 (Year: 2018).*
European Patent Office, Partial European Search Report (Rule 164 (1) EPC) of May 10, 2022, in the corresponding EP patent application No. 19837665.9, Munich Germany, 17 pages.
European Patent Office, Extended European Search Report of Aug. 22, 2022, in the corresponding EP patent application No. 19837665.9, Munich Germany, 20 pages.
Office Action issued for the corresponding JP patent application No. 2021-098418, JPO, Japan, May 30, 2023, 5 pages.
Office Action dated Dec. 8, 2020, issued for the corresponding JP patent application No. 2020-531216, JPO, 7 pages.
Final Office Action dated Apr. 6, 2021, issued for the corresponding JP patent application No. 2020-531216, JPO, 5 pages.

* cited by examiner

SUBSTRATE BONDING DEVICE

CROSS-REFERENCE TO RELATED APPLICATIONS

This application claims priority to JP Patent Application No. 2018-135801 filed on Jul. 19, 2018, and to PCT Application No. PCT/JP2019/026226 filed on Jul. 2, 2019, the entire contents of which are hereby incorporated by reference.

TECHNICAL FIELD

The present disclosure relates to a substrate bonding device.

BACKGROUND ART

Devices that are devices for bonding two substrates to each other and include a mounting device on which substrates are mounted at the time of bonding have been proposed (see, for example, Patent Literature 1). A mounting device described in Patent Literature 1 includes an annular portion that holds a peripheral portion of a substrate, using a vacuum chuck and is located on the outer side and deforming means that deforms the substrate in such a manner as to make a central portion of the substrate protrude out of the mounting device. The device brings two substrates to a state in which central portions of bonding surfaces of the substrates are in contact with each other and subsequently bonds the two substrates to each other by releasing sucking and holding of a peripheral portion of one the substrates by the vacuum chuck.

CITATION LIST

Patent Literature

Patent Literature 1: International Publication No. WO 2013/023708

SUMMARY OF INVENTION

Technical Problem

However, when sucking and holding of a peripheral portion of one of the substrates is released as in the device described in Patent Literature 1, the substrate is sometimes stuck on the substrate mounting surface of the mounting device due to electrostatic force generated in the peripheral portion of the substrate even when the vacuum chuck that sucks and holds the peripheral portion of the substrate is made to stop operating. In this case, the bonding has to be performed by making the two substrates come close to each other while a peripheral portion of one of the substrates is stuck on the mounting device. This constraint causes the substrates to be bonded to each other while distortion is generated in one of the substrates, as a result of which there is a possibility that the substrates are bonded to each other while relative positions between the bonded two substrates are misaligned.

The present disclosure has been made in consideration of the above-described conditions, and an objective of the disclosure is to provide a substrate bonding device that is capable of bonding substrates to each other without distortion, over the whole surfaces, and with high positional precision.

Solution to Problem

In order to achieve the above-described objective, a substrate bonding device according to the present disclosure is a substrate bonding device that bonds a first substrate and a second substrate to each other and that includes:

a first support base supporting the first substrate;

a second support base supporting the second substrate while a bonding surface of the second substrate is made to face a bonding surface of the first substrate;

a first holder disposed on the first support base and holding a peripheral portion of the first substrate;

a holder driver driving the first holder; and a controller controlling the holder driver to release holding of a peripheral portion of the first substrate by the first holder when a bonding surface of the first substrate and a bonding surface of the second substrate are bonded together over the whole surfaces by making a peripheral portion of the first substrate come into contact with a peripheral portion of the second substrate while the first substrate is supported by the first support base with the first substrate bowed in such a way that a central portion of the first substrate protrudes to the second substrate side with respect to a peripheral portion of the first substrate and a central portion of the bonding surface of the first substrate and a central portion of the bonding surface of the second substrate are in contact with each other, in which the first holder includes a first electrostatic chuck disposed in a first area on the first support base, the first area facing a peripheral portion of the first substrate while the first support base holds the first substrate, the holder driver drives the first electrostatic chuck by applying voltage to the first electrostatic chuck, and the controller controls the holder driver to release holding of a peripheral portion of the first substrate by the first electrostatic chuck when a peripheral portion of the first substrate is made to come into contact with a peripheral portion of the second substrate while a central portion of the bonding surface of the first substrate and a central portion of the bonding surface of the second substrate are in contact with each other.

The substrate bonding device according to another aspect of the present disclosure is a substrate bonding device that bonds a first substrate and a second substrate to each other and that includes:

a first support base supporting the first substrate;

a second support base supporting the second substrate while a bonding surface of the second substrate is made to face a bonding surface of the first substrate;

a first holder holding a peripheral portion of the first substrate while the first support base supports the first substrate;

a holder driver driving the first holder; and a controller controlling the holder driver to release holding of a peripheral portion of the first substrate by the first holder when a bonding surface of the first substrate and a bonding surface of the second substrate are bonded together over the whole surfaces by making a peripheral portion of the first substrate come into contact with a peripheral portion of the second substrate while the first substrate is supported by the first support base with the first substrate bowed in such a way that a central portion of the first substrate protrudes to the second substrate side with respect to a peripheral portion of the first substrate and a central portion of the bonding surface of the first substrate and a central portion of the bonding surface of the second substrate are in contact with each other, in which the first support base has an irregularity formed at least on an inner side of a substrate contact area, the substrate contact area facing the first substrate while the first support base supports the first substrate.

The substrate bonding device according to still another aspect of the present disclosure is a substrate bonding device that bonds a first substrate and a second substrate to each other and that includes:
a first support base supporting the first substrate;
a second support base supporting the second substrate while a bonding surface of the second substrate is made to face a bonding surface of the first substrate;
a first holder holding a peripheral portion of the first substrate while the first support base supports the first substrate;
a holder driver driving the first holder; and
a controller controlling the holder driver to release holding of a peripheral portion of the first substrate by the first holder when a bonding surface of the first substrate and a bonding surface of the second substrate are bonded together over the whole surfaces by making a peripheral portion of the first substrate come into contact with a peripheral portion of the second substrate while the first substrate is supported by the first support base with the first substrate bowed in such a way that a central portion of the first substrate protrudes to the second substrate side with respect to a peripheral portion of the first substrate and a central portion of the bonding surface of the first substrate and a central portion of the bonding surface of the second substrate are in contact with each other, in which the first support base has at least one rib extending from a central portion of a recess, the recess being disposed in a second area located on an inner side of a first area facing a peripheral portion of the first substrate, to a periphery of the recess on the first support base and coming into contact with the first substrate.

Advantageous Effects of Invention

According to the present disclosure, the controller controls the holder driver to release holding of a peripheral portion of the first substrate by the first electrostatic chuck when a peripheral portion of the first substrate is made to come into contact with a peripheral portion of the second substrate while a central portion of the first substrate and a central portion of the second substrate are in contact with each other. In addition, according to the present disclosure, the first support base has an irregularity formed on a substrate contact area, the substrate contact area facing the first substrate while the first support base supports the first substrate. Further, according to the present disclosure, the first support base has at least one rib extending from a central portion of a recess, the recess being disposed in a second area located on the inner side of a first area facing a peripheral portion of the first substrate, to the periphery of the recess on the first support base and coming into contact with the first substrate. When, after the first substrate has been bowed and the central portion of the first substrate and the central portion of the second substrate have thereby been made to come into contact with each other, the peripheral portion of the first substrate is made to come into contact with the peripheral portion of the second substrate, this configuration enables sticking of a portion located on the inner side of the peripheral portion of the first substrate on the first support base to be suppressed and sticking of the peripheral portion of the first substrate on the first support base to be suppressed, it is possible to avoid bonding of the first substrate and the second substrate to each other while distortion is generated in the first substrate and to bond the first substrate and the second substrate to each other without distortion, over the whole surfaces, and with high positional precision.

DESCRIPTION OF EMBODIMENTS

Embodiment 1

Figure 1:
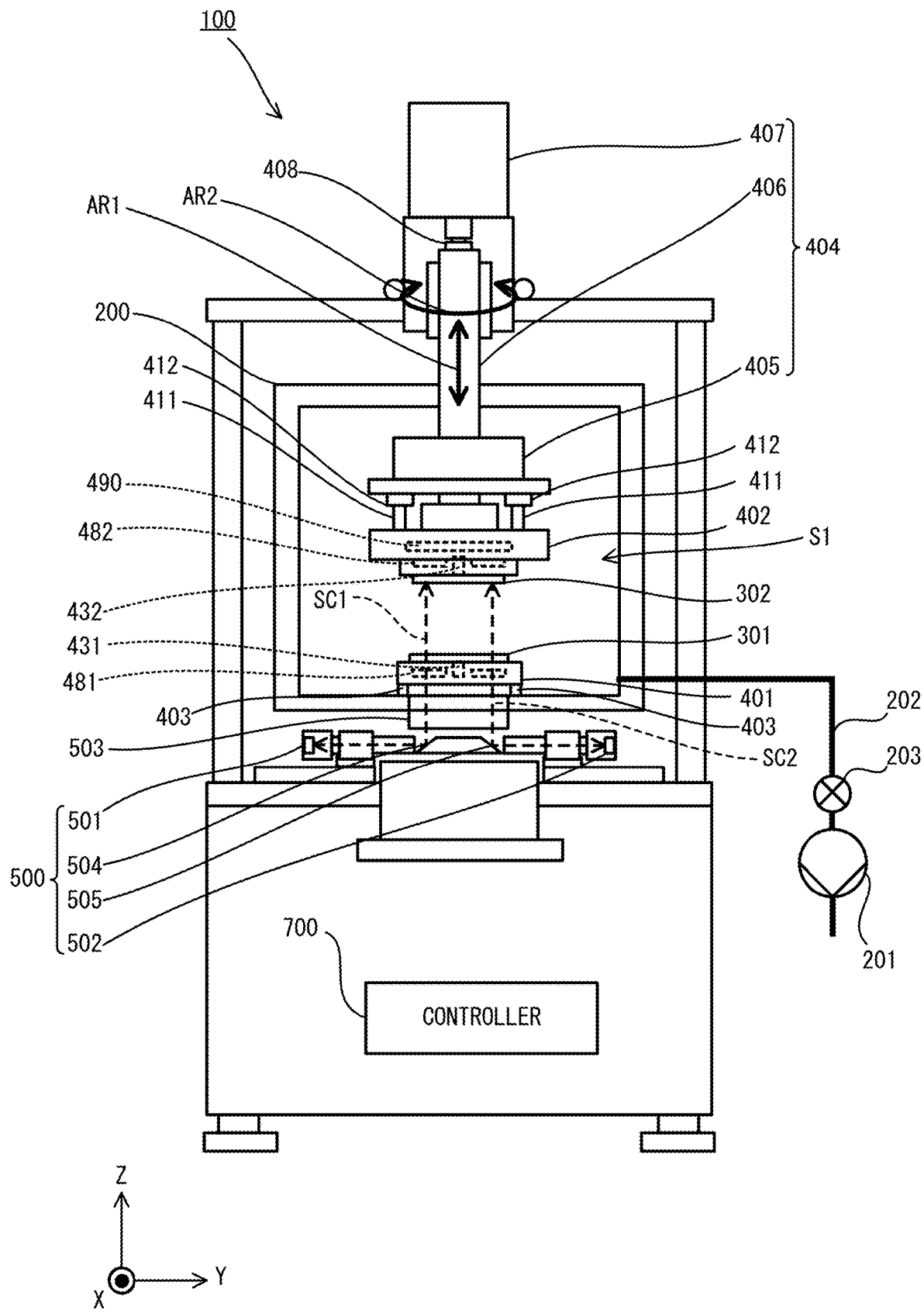
FIG. 1 is a schematic front view of a substrate bonding device according to Embodiment 1 of the present disclosure.

A substrate bonding device according to an embodiment of the present disclosure will be described below, referring to the drawings. The substrate bonding device according to the present embodiment bonds two substrates on the bonding surfaces of which, which are to be bonded to each other, activation treatment and hydrophilization treatment were performed, to each other by making the two substrates come into contact with each other and pressurizing and heating the two substrates in a vacuum chamber having a degree of vacuum equal to or greater than a preset reference degree of vacuum. In the above-described activation treatment, a bonding surface of a substrate is activated by irradiating the bonding surface of the substrate with specific energy particles. In the hydrophilization treatment, a bonding surface of a substrate is hydrophilized by supplying the vicinity of the bonding surface of the substrate, which was activated by the activation treatment, with water or the like.

As illustrated in FIG. 1, a substrate bonding device 100 according to the present embodiment includes a vacuum chamber 200, a stage 401 that is a first support base, a head 402 that is a second support base, a stage driver 403, a head driver 404, substrate heaters 481 and 482, and a position measurer 500. The substrate bonding device 100 also includes a distance measurer 490 that measures distance between the stage 401 and the head 402. Note that the following description will be made, appropriately assuming that in FIG. 1, the ±Z directions are the vertical direction and XY directions are horizontal directions.

The vacuum chamber 200 maintains a space S1 in which a substrate 301, which is a first substrate, and a substrate 302, which is a second substrate, are arranged at a degree of vacuum equal to or greater than a preset reference degree of vacuum. The vacuum chamber 200 is connected to a vacuum pump 201 via an exhaust pipe 202 and an exhaust valve 203. When the exhaust valve 203 is brought to the open state and the vacuum pump 201 is operated, gas in the vacuum chamber 200 is exhausted to the outside of the vacuum chamber 200 through the exhaust pipe 202 and gas pressure in the vacuum chamber 200 is thereby reduced (pressure reduction). Varying an opening/closing amount of the exhaust valve 203 and thereby regulating an exhaust amount enables the gas pressure (degree of vacuum) inside the vacuum chamber 200 to be regulated. On a portion of the vacuum chamber 200, a window 503, which is used by the position measurer 500 for measuring a relative position between the substrates 301 and 302, is disposed. Note that the afore-described reference degree of vacuum is preferably equal to or less than 10000 Pa, which is a range of degrees of vacuum in which no void due to drawing-in of air into an interspace between the bonded substrates 301 and 302 is generated. In addition, the reference degree of vacuum is more preferably equal to or less than 1000 Pa, and still more preferably equal to or less than 100 Pa.

The stage driver 403 is capable of moving the stage 401 in XY directions and rotating the stage 401 about the Z-axis.

The head driver 404 includes an ascent/descent driver 406 that is a second support base driver and makes the head 402 ascend vertically upward or descend vertically downward (see an arrow AR1 in FIG. 1), an XY direction driver 405 that moves the head 402 in XY directions, and a rotation driver 407 that rotates the head 402 in the rotational direction about the Z-axis (see an arrow AR2 in FIG. 1). The XY direction driver 405 and the rotation driver 407 constitute a first support base driver that moves the head 402 in directions orthogonal to the vertical direction (XY directions, the rotational direction about the Z-axis). The head driver 404 also includes piezo-actuators 411 for adjusting inclination of the head 402 with respect to the stage 401 and first pressure sensors 412 for measuring pressure applied to the head 402. The XY direction driver 405 and the rotation driver 407 relatively moving the head 402 with respect to the stage 401 in the X-direction, the Y-direction, and the rotational direction about the Z-axis enables alignment between the substrate 301 held by the stage 401 and the substrate 302 held by the head 402.

The ascent/descent driver 406 makes the stage 401 and the head 402 come close to each other or moves the head 402 away from the stage 401 by moving the head 402 in the vertical direction. The ascent/descent driver 406 moving the head 402 vertically downward causes the substrate 301 held by the stage 401 and the substrate 302 held by the head 402 to come into contact with each other. When the ascent/descent driver 406 exerts a driving force in a direction approaching the stage 401 on the head 402 while the substrates 301 and 302 are in contact with each other, the substrate 302 is pressed against the substrate 301. In addition, to the ascent/descent driver 406, a second pressure sensor 408 that measures a driving force that the ascent/descent driver 406 exerts on the head 402 in the direction approaching the stage 401 is disposed. From a measured value by the second pressure sensor 408, pressure exerted on the bonding surfaces of the substrates 301 and 302 when the substrate 302 is pressed against the substrate 301 by the ascent/descent driver 406 can be detected. The second pressure sensor 408 is constituted by, for example, a load cell.

Figure 2A:
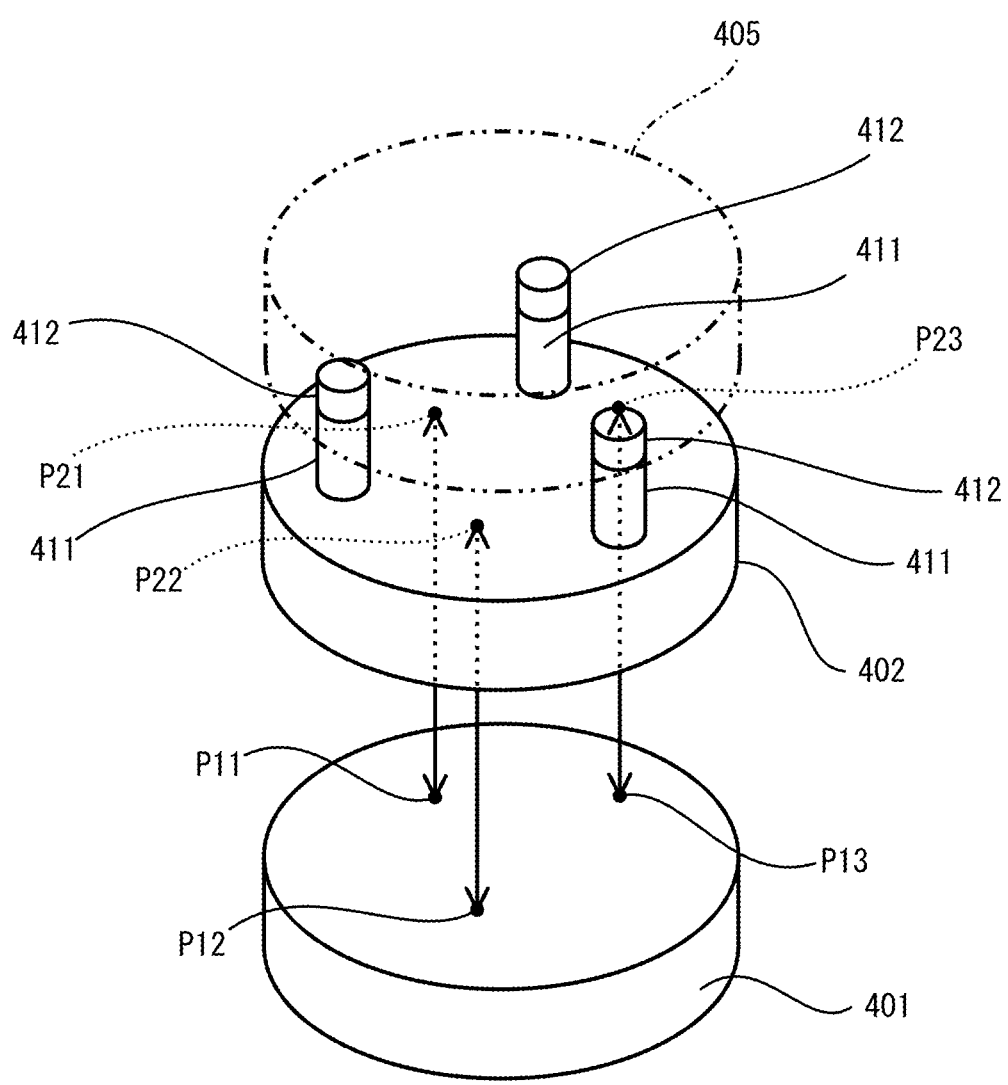
FIG. 2A is a schematic perspective view illustrating a vicinity of a stage and a head according to Embodiment 1.
Figure 2B:
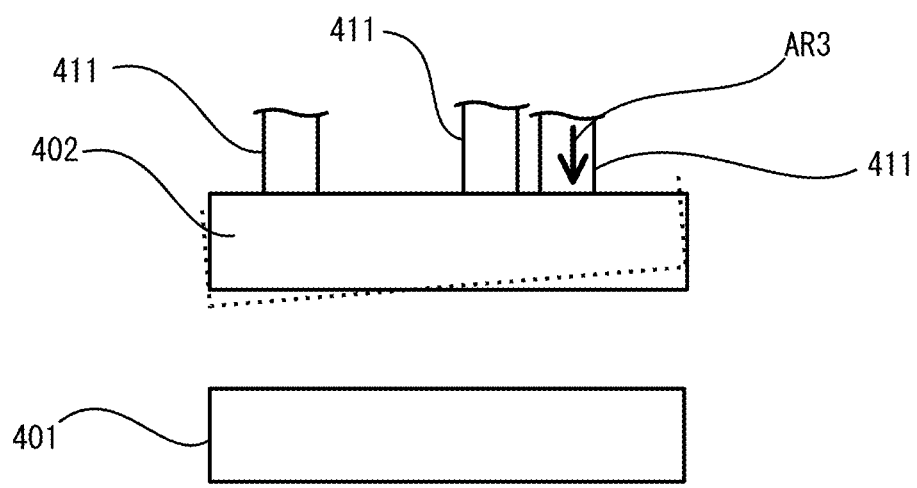
FIG. 2B is a diagram describing a method for finely adjusting the head according to Embodiment 1.

The piezo-actuators 411 and the first pressure sensors 412 are respectively provided in a number of three, as illustrated in FIG. 2A. The three piezo-actuators 411 and the three first pressure sensors 412 are arranged between the head 402 and the XY direction driver 405. The three piezo-actuators 411 are fixed at three positions that are not aligned on an identical straight line on the upper surface of the head 402, that is, three positions that are arranged at substantially equal intervals along the circumferential direction of the head 402 in a peripheral portion of the upper surface of the head 402, which has a substantially circular shape in plan view. Each of the three first pressure sensors 412 connects the top end of one of the piezo-actuators 411 to the under surface of the XY direction driver 405. The three piezo-actuators 411 are individually extensible and retractable in the vertical direction. The three piezo-actuators 411 extending and retracting causes inclinations about the X-axis and the Y-axis of the head 402 and a position in the vertical direction of the head 402 to be finely adjusted. For example, when the head 402 is inclined with respect to the stage 401 as illustrated by a dashed line in FIG. 2B, extending one of the three piezo-actuators 411 (see an arrow AR3 in FIG. 2B) and thereby finely adjusting the attitude of the head 402 enable the under surface of the head 402 and the upper surface of the stage 401 to be made substantially parallel with each other. The three first pressure sensors 412 measure pressurizing force at three positions on the under surface of the head 402. Driving each of the three piezo-actuators 411 in such a way that pressurizing forces measured by the three first pressure sensors 412 become equal to each other, while enabling the under surface of the head 402 and the upper surface of the stage 401 to be kept substantially parallel with each other, enables the substrates 301 and 302 to come into contact with each other.

Figure 3A:
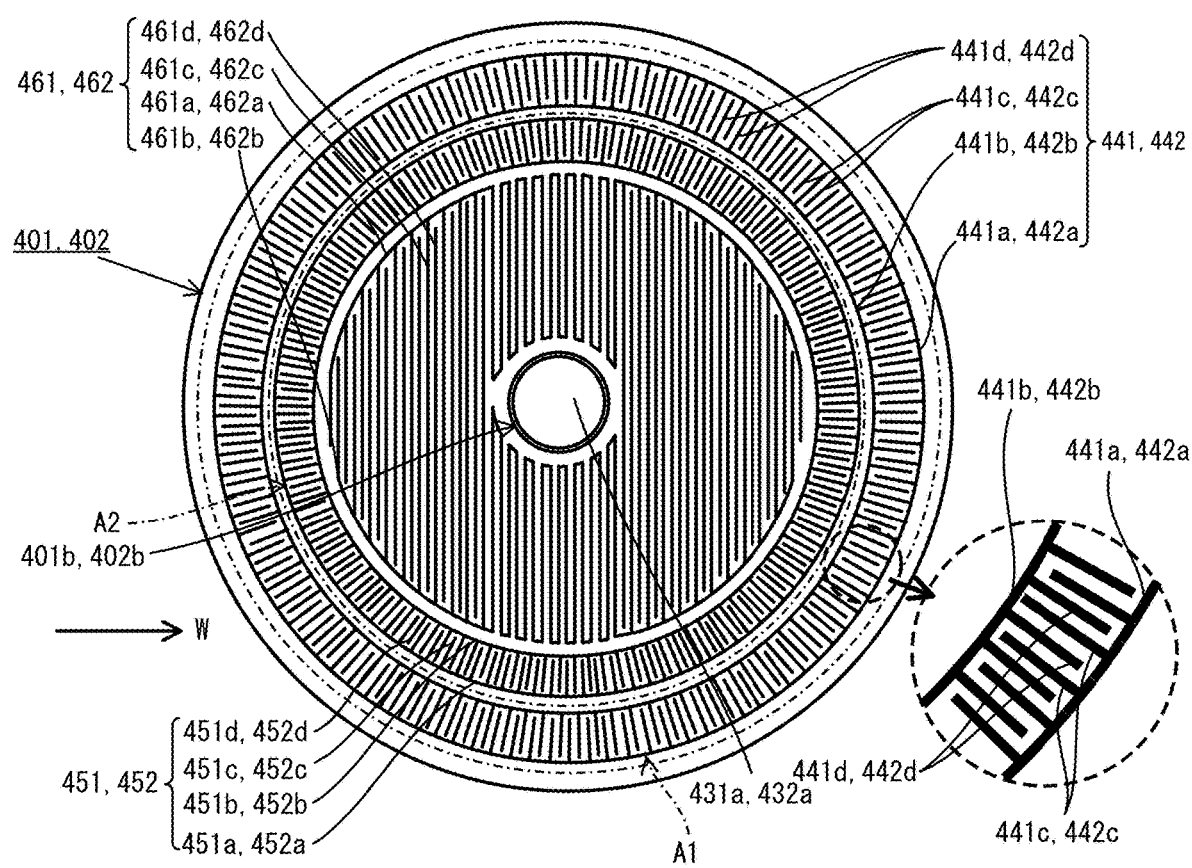
FIG. 3A is a schematic plan view of the stage and the head according to Embodiment 1.
Figure 3B:
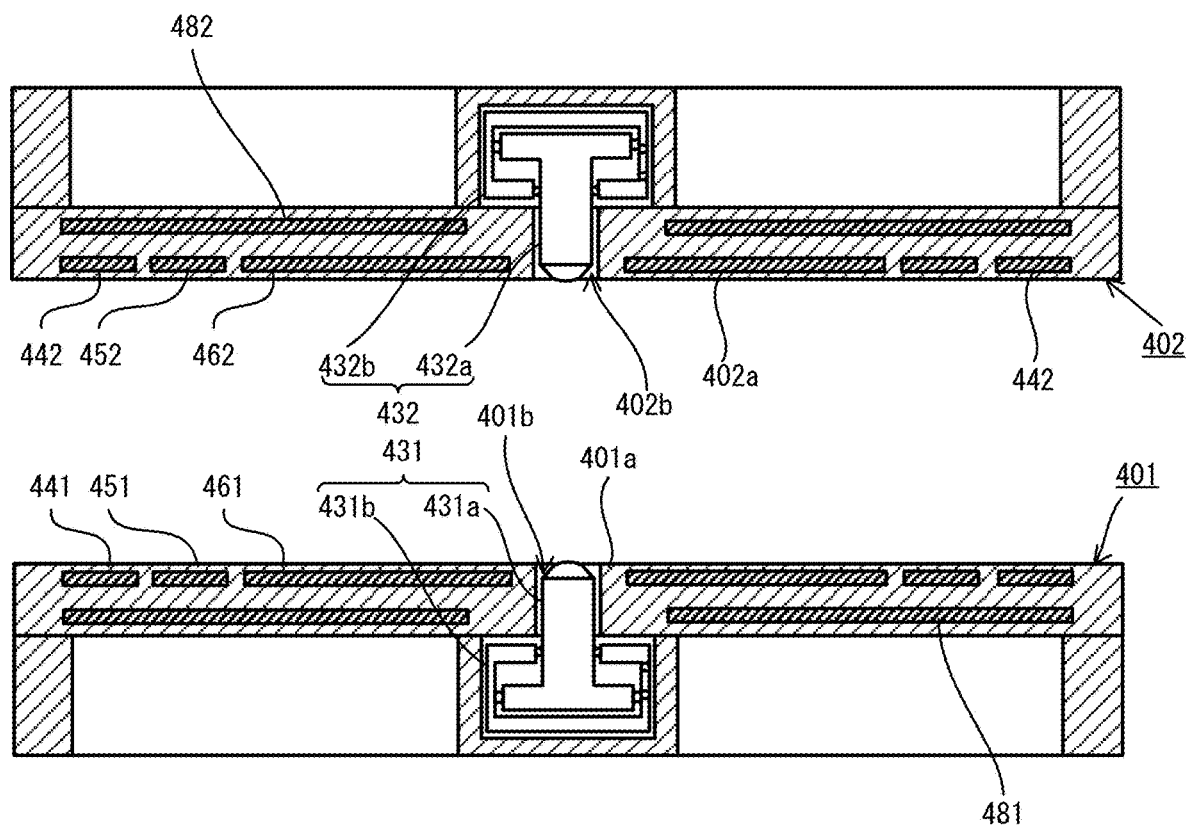
FIG. 3B is a schematic cross-sectional view of the stage and the head according to Embodiment 1.

The stage 401 and the head 402 are arranged to face each other in the vertical direction in the vacuum chamber 200. The stage 401 supports the substrate 301 on an upper surface 401a thereof, and the head 402 supports the substrate 302 on an under surface 402a thereof. The stage 401 supports the substrate 301 while the upper surface 401a thereof is in surface contact with the entire under surface of the substrate 301, and the head 402 supports the substrate 302 while the under surface 402a thereof is in surface contact with the entire upper surface of the substrate 302. The stage 401 and the head 402 are formed of a translucent material, such as glass having translucency. On the stage 401 and the head 402, electrostatic chucks 441, 442, 451, 452, 461, and 462 that hold the substrates 301 and 302, a first pressing mechanism 431 that presses a central portion of the substrate 301, and a second pressing mechanism 432 that presses a central portion of the substrate 302 are disposed, as illustrated in FIGS. 3A and 3B. The electrostatic chucks 441 and 442 are a first holder and a third holder that hold peripheral portions of the substrates 301 and 302, respectively. The electrostatic chucks 451 and 461 and the electrostatic chucks 452 and 462 are a second holder and a fourth holder that hold portions located on the inner side of the peripheral portions of the substrates 301 and 302, respectively. At the central portions of the stage 401 and the head 402, through-holes 401b and 402b that have a circular shape in plan view are disposed, respectively.

The electrostatic chucks 441 and 442 are first electrostatic chucks that are disposed in first areas A1 on the stage 401 and the head 402, the first areas A1 facing the peripheral portions of the substrates 301 and 302 while the substrates 301 and 302 are supported by the stage 401 and the head 402, respectively. The electrostatic chucks 441 and 442 include terminal electrodes 441a and 441b and terminal electrodes 442a and 442b and pluralities of electrode elements 441c and 441d and pluralities of electrode elements 442c and 442d, respectively. The terminal electrodes 441a and 442a are first terminal electrodes that are formed in an annular shape and that are arranged along the circumferential direction on the outer side in the first areas A1 on the stage 401 and the head 402, respectively. The terminal electrodes 441b and 442b are second terminal electrodes that are formed in an annular shape and have smaller diameters than the terminal electrodes 441a and 442a and that are arranged along the circumferential direction on the inner side in the first areas A1 on the stage 401 and the head 402, respectively.

The pluralities of electrode elements 441c and 442c are first electrode elements each of which is formed in a straight line shape, the base end portions of which are electrically connected to the terminal electrodes 441a and 442a, and the tip portions of which extend toward the central portions of the stage 401 and the head 402, respectively. The pluralities of electrode elements 441d and 442d are second electrode elements each of which is formed in a straight line shape, the base end portions of which are electrically connected to the terminal electrodes 441b and 442b, and the tip portions of which extend in directions away from the central portions of the stage 401 and the head 402, that is, extend outward, respectively. The pluralities of electrode elements 441c and 442c and the pluralities of electrode elements 441d and 442d are arranged in such a manner as to be alternately lined up along the circumferential direction of the first areas A1, which is a first direction, in the first areas A1 on the stage 401 and the head 402, respectively. Inter-electrode element distances between the electrode elements 441c and 442c and the electrode elements 441d and 442d that are adjacent to each other in the circumferential direction of the stage 401 and the head 402, respectively, are set at equal to or less than 10 mm. Note that the inter-electrode element distances are preferably equal to or less than 5 mm, and more preferably equal to or less than 2 mm. The terminal electrodes 441a, 441b, 442a, and 442b and the pluralities of electrode elements 441c, 441d, 442c, and 442d are formed of a transparent conductive film containing a transparent conductive material, such as ITO.

The electrostatic chucks 451 and 461 and the electrostatic chucks 452 and 462 are second electrostatic chucks that are disposed in second areas A2 that are located on the inner side of the first areas A1 on the stage 401 and the head 402 while the substrates 301 and 302 are supported by the stage 401 and the head 402, respectively. The electrostatic chucks 451 and 452 include terminal electrodes 451a and 451b and terminal electrodes 452a and 452b and pluralities of electrode elements 451c and 451d and pluralities of electrode elements 452c and 452d, respectively. The terminal electrodes 451a and 452a are third terminal electrodes that are formed in an annular shape and that are arranged along the circumferential direction on the outer side in the second areas A2 on the stage 401 and the head 402, respectively. The terminal electrodes 451b and 452b are fourth terminal electrodes that are formed in an annular shape and have smaller diameters than the terminal electrodes 451*a* and 452*a* and that are arranged along the circumferential direction on the inner side of the terminal electrodes 451*a* and 452*a* in the second areas A2 on the stage 401 and the head 402, respectively.

The pluralities of electrode elements 451*c* and 452*c* are third electrode elements each of which is formed in a straight line shape, the base end portions of which are electrically connected to the terminal electrodes 451*a* and 452*a*, and the tip portions of which extend toward the central portions of the stage 401 and the head 402, respectively. The pluralities of electrode elements 451*d* and 452*d* are fourth electrode elements each of which is formed in a straight line shape, the base end portions of which are electrically connected to the terminal electrodes 451*b* and 452*b*, and the tip portions of which extend in directions away from the central portions of the stage 401 and the head 402, that is, extend outward, respectively. The pluralities of electrode elements 451*c* and 452*c* and the pluralities of electrode elements 451*d* and 452*d* are arranged in such a manner as to be alternately lined up in a direction along the peripheries of the second areas A2, which is a second direction, in the second areas A2 on the stage 401 and the head 402, respectively. Inter-electrode element distances between the electrode elements 451*c* and 452*c* and the electrode elements 451*d* and 452*d* that are adjacent to each other in the circumferential direction of the stage 401 and the head 402, respectively, are set at equal to or less than 10 mm. Note that the inter-electrode element distances are preferably equal to or less than 5 mm, and more preferably equal to or less than 2 mm. The terminal electrodes 451*a*, 451*b*, 452*a*, and 452*b* and the pluralities of electrode elements 451*c*, 451*d*, 452*c*, and 452*d* are formed of a transparent conductive film containing a transparent conductive material, such as ITO.

The electrostatic chucks 461 and 462 include terminal electrodes 461*a* and 461*b* and terminal electrodes 462*a* and 462*b* and pluralities of electrode elements 461*c* and 461*d* and pluralities of electrode elements 462*c* and 462*d*, respectively. The terminal electrodes 461*a* and 462*a* are third terminal electrodes that are arranged in the second areas A2 on the stage 401 and the head 402, respectively. The terminal electrodes 461*a* and 462*a* have circular-arc shaped portions that are arranged along the peripheries on the inner side of the terminal electrodes 451*b* and 452*b*, respectively. The terminal electrodes 461*b* and 462*b* are also third terminal electrodes that are arranged in the second areas A2 on the stage 401 and the head 402, respectively. The terminal electrodes 461*b* and 462*b* also have circular-arc shaped portions that are arranged along the peripheries on the inner side of the terminal electrodes 451*b* and 452*b*, respectively.

The pluralities of electrode elements 461*c* and 462*c* are third electrode elements each of which is formed in a straight line shape, the base end portions of which are electrically connected to the terminal electrodes 461*a* and 462*a*, and the tip portions of which extend in a direction orthogonal to a W-axis direction in FIG. 3A, respectively. The pluralities of electrode elements 461*d* and 462*d* are fourth electrode elements each of which is formed in a straight line shape, the base end portions of which are electrically connected to the terminal electrodes 461*b* and 462*b*, and the tip portions of which extend in the direction orthogonal to the W-axis direction in FIG. 3A, respectively. The pluralities of electrode elements 461*c* and 462*c* and the pluralities of electrode elements 461*d* and 462*d* are arranged in such a manner as to be alternately lined up in the W-axis direction on the stage 401 and the head 402, respectively. Inter-electrode element distances between the electrode elements 461*c* and 462*c* and the electrode elements 461*d* and 462*d* that are adjacent to each other in the W-axis direction, respectively, are set at equal to or less than 10 mm. Note that the inter-electrode element distances are preferably equal to or less than 5 mm, and more preferably equal to or less than 2 mm. The terminal electrodes 461*a*, 461*b*, 462*a*, and 462*b* and the pluralities of electrode elements 461*c*, 461*d*, 462*c*, and 462*d* are formed of a transparent conductive film containing a transparent conductive material, such as ITO.

Figure 4:
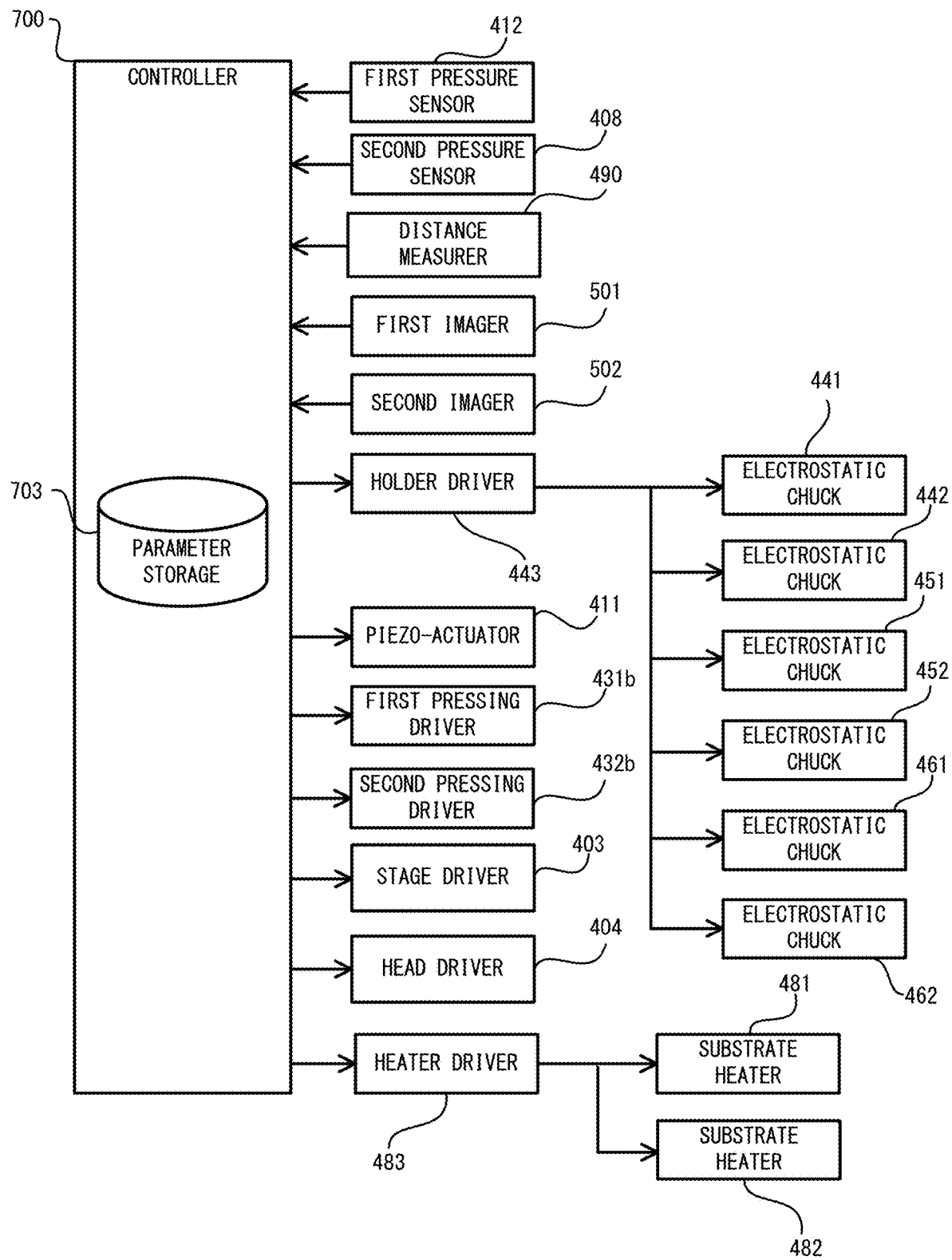
FIG. 4 is a block diagram illustrating a configuration of a portion of the substrate bonding device according to Embodiment 1.

The electrostatic chucks 441, 442, 451, 452, 461, and 462 are connected to a holder driver 443, as illustrated in FIG. 4. The holder driver 443 applies voltage to the respective electrostatic chucks 441, 442, 451, 452, 461, and 462 and thereby drives the electrostatic chucks 441, 442, 451, 452, 461, and 462, based on a control signal input from a controller 700. The holder driver 443 drives the electrostatic chucks 441, 442, 451, 452, 461, and 462 independently from one another, based on a control signal input from the controller 700.

As illustrated in FIG. 3B, the first pressing mechanism 431 is disposed at the central portion of the stage 401, and the second pressing mechanism 432 is disposed at the central portion of the head 402. The first pressing mechanism 431 includes a first pressing rod 431*a* that is projectable and retractable to and from the head 402 side through the through-hole 401*b* of the stage 401 and a first pressing driver 431*b* that drives the first pressing rod 431*a*. The second pressing mechanism 432 includes a second pressing rod 432*a* that is projectable and retractable to and from the stage 401 side through the through-hole 402*b* of the head 402 and a second pressing driver 432*b* that drives the second pressing rod 432*a*. Each of the first pressing driver 431*b* and the second pressing driver 432*b* includes, for example, a voice coil motor. On each of the first pressing rod 431*a* and the second pressing rod 432*a*, either pressure control for controlling pressure applied to the substrates 301 and 302 to be maintained constant or position control for controlling a contact position between the substrates 301 and 302 to be maintained constant is performed. For example, the first pressing rod 431*a* being subjected to the position control and the second pressing rod 432*a* being subjected to the pressure control cause the substrates 301 and 302 to be pressed at a constant position and a constant pressure.

Returning to FIG. 1, the distance measurer 490 is, for example, a laser range finder and measures distance between the stage 401 and the head 402 without coming into contact with the stage 401 and the head 402. The distance measurer 490 measures distance between the stage 401 and the head 402 from a difference between reflected light reflected by the upper surface of the stage 401 and reflected light reflected by the under surface of the head 402 when laser light is radiated from above the transparent head 402 toward the stage 401. The distance measurer 490 measures distances between three parts P11, P12, and P13 on the upper surface of the stage 401 and three parts P21, P22, and P23 on the under surface of the head 402 that face the parts P11, P12, and P13 in the Z-direction, respectively, as illustrated in FIG. 2A.

Returning to FIG. 1, the position measurer 500 measures misalignment amounts between the substrate 301 and the substrate 302 in directions orthogonal to the vertical direction (XY directions and the rotational direction about the Z-axis). The position measurer 500 includes a first imager 501, a second imager 502, and mirrors 504 and 505. The first imager 501 and the second imager 502 are arranged on the opposite side of the stage 401 to the side thereof on which the substrate 301 is supported. Each of the first imager 501 and the second imager 502 includes an imaging element (not illustrated) and a coaxial illumination system (not illustrated). As light sources of the coaxial illumination systems, light sources that emit light (for example, infrared light) that is transmitted through the substrates 301 and 302, the stage 401, and the window 503 disposed to the vacuum chamber 200 are used.

Figure 5A:
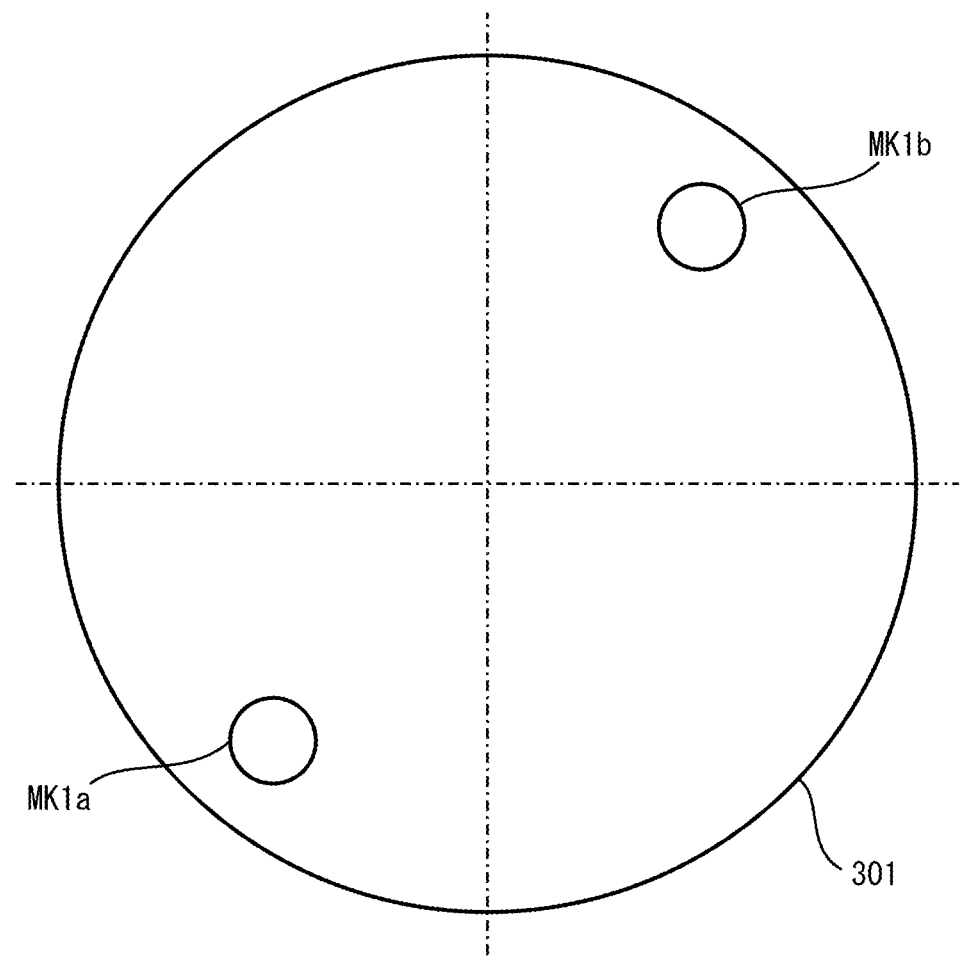
FIG. 5A is a diagram illustrating two alignment marks disposed on one of two substrates to be bonded to each other.
Figure 5B:
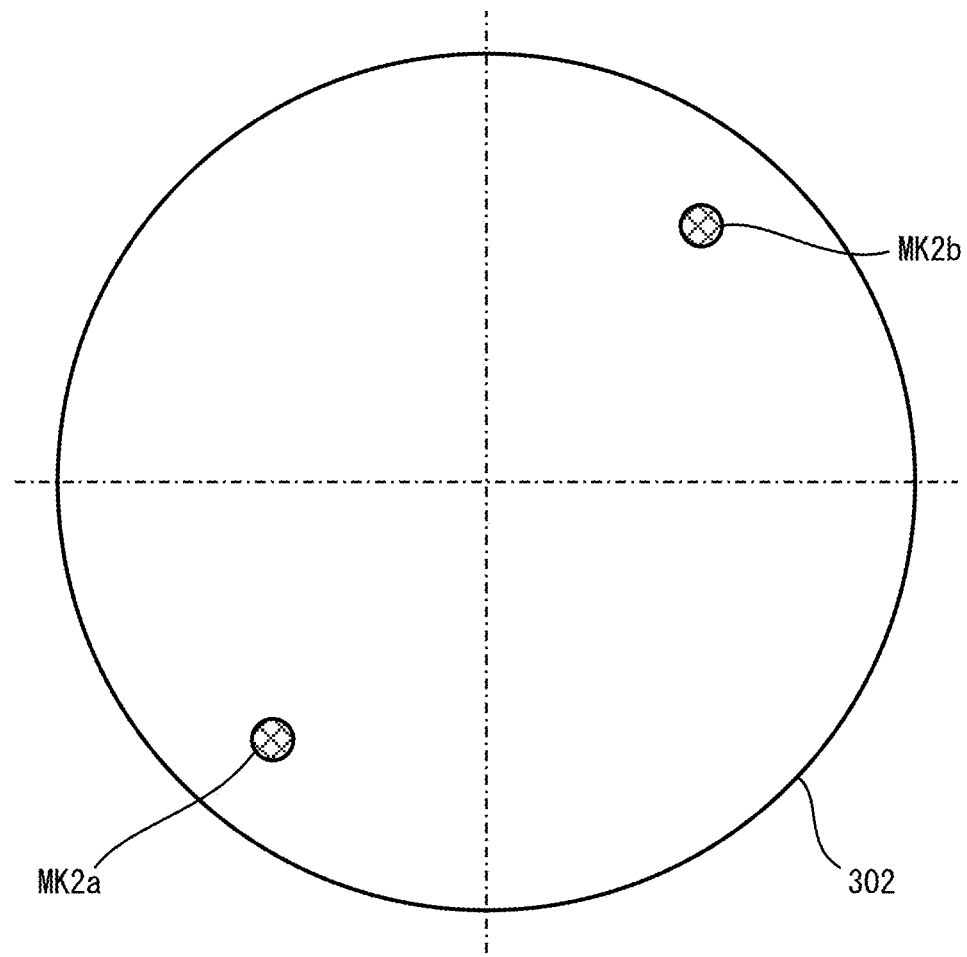
FIG. 5B is a diagram illustrating two alignment marks disposed on the other of the two substrates to be bonded to each other.

For example, as illustrated in FIGS. 5A and 5B, two alignment marks MK1a and MK1b that are first alignment marks are disposed on the substrate 301, and two alignment marks MK2a and MK2b that are second alignment marks are disposed on the substrate 302. The substrate bonding device 100, recognizing positions of the respective alignment marks MK1a, MK1b, MK2a, and MK2b, which are disposed on both substrates 301 and 302, by use of the position measurer 500, performs position alignment operation (alignment operation) of both substrates 301 and 302. More in detail, the substrate bonding device 100, recognizing the alignment marks MK1a, MK1b, MK2a, and MK2b, which are disposed on the substrates 301 and 302, by use of the position measurer 500, performs rough alignment operation of the substrates 301 and 302 and makes the two substrates 301 and 302 face each other. Subsequently, the substrate bonding device 100, simultaneously recognizing the alignment marks MK1a, MK2a, MK1b, and MK2b, which are disposed on the two substrates 301 and 302, by use of the position measurer 500, further performs fine alignment operation.

Figure 6A:
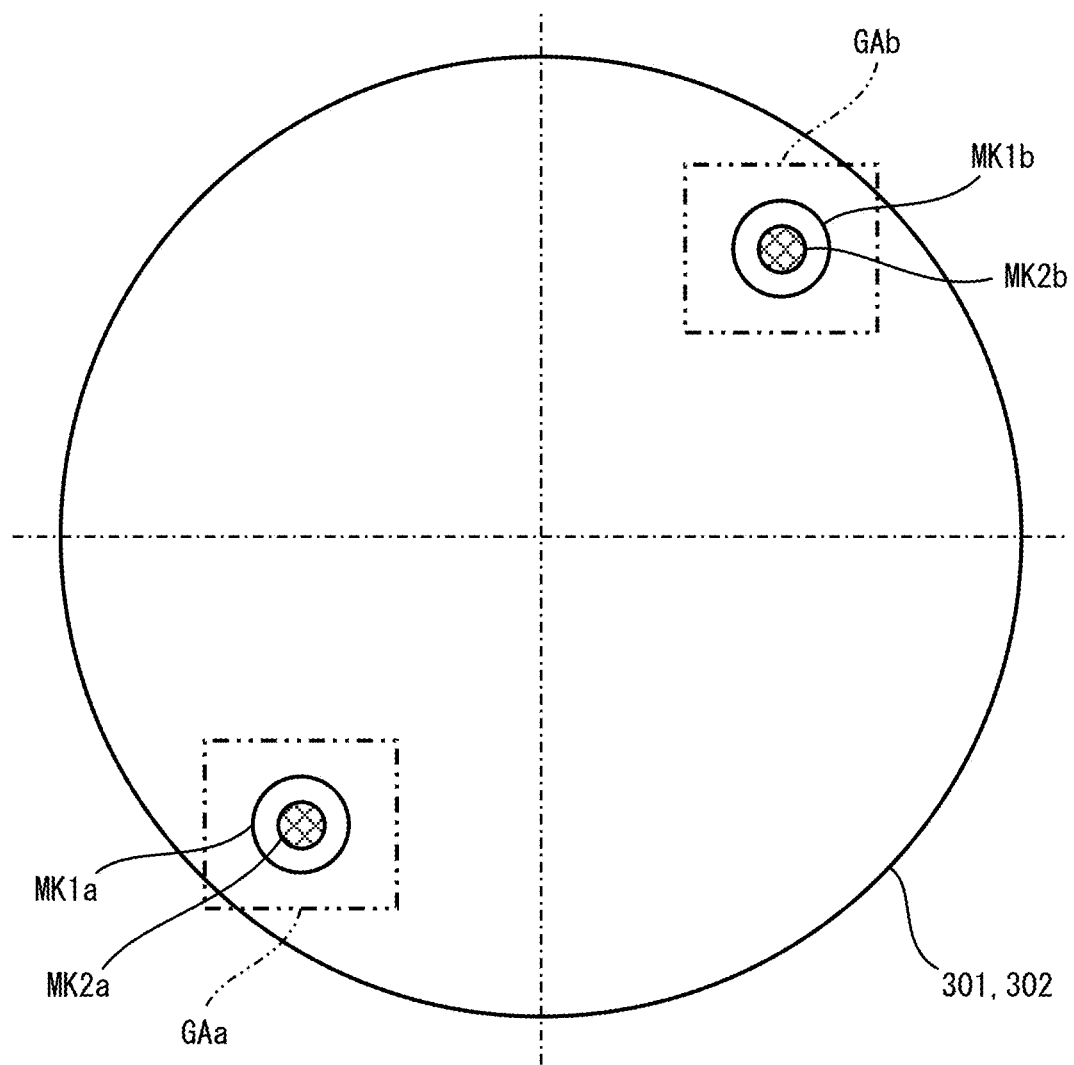
FIG. 6A is a schematic view illustrating a captured image of the alignment marks.
Figure 6B:
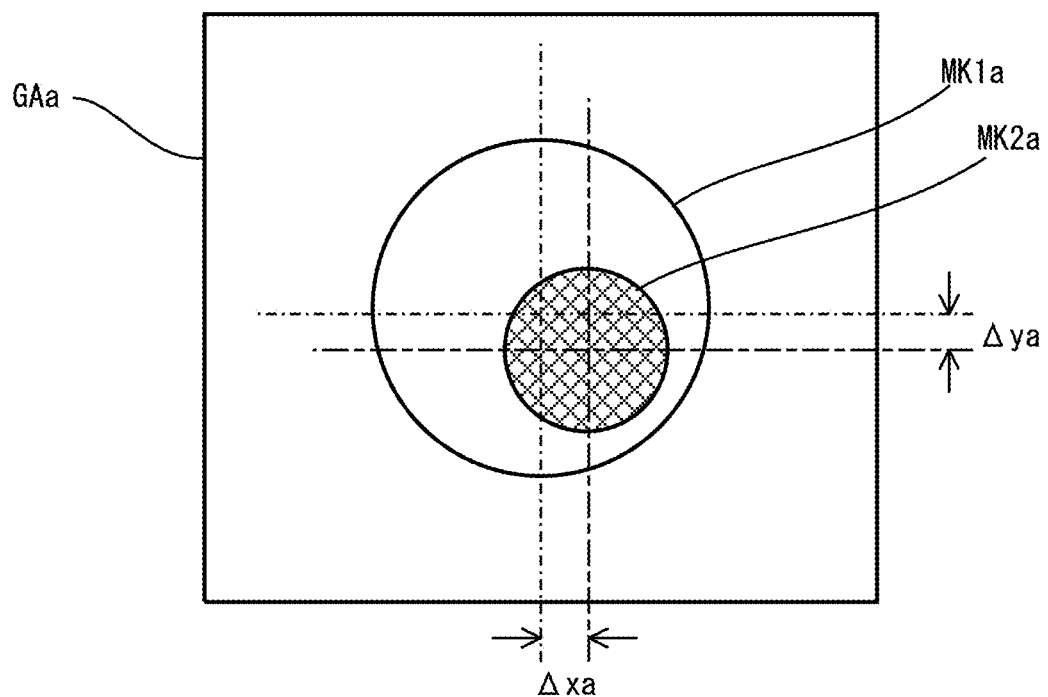
FIG. 6B is a schematic view illustrating a state in which the alignment marks are misaligned from each other.

In this operation, as illustrated by dashed-line arrows SC1 and SC2 in FIG. 1, light emitted from the light source of the coaxial illumination system of the first imager 501 is reflected by the mirror 504, proceeds upward, and is transmitted through the window 503 and portions or all of the substrates 301 and 302. The light that has been transmitted through portions or all of the substrates 301 and 302 is reflected by the alignment marks MK1a and MK2a on the substrates 301 and 302, proceeds downward, is transmitted through the window 503, is reflected by the mirror 504, and is incident on the imaging element of the first imager 501. In addition, light emitted from the light source of the coaxial illumination system of the second imager 502 is reflected by the mirror 505, proceeds upward, and is transmitted through the window 503 and portions or all of the substrates 301 and 302. The light that has been transmitted through portions or all of the substrates 301 and 302 is reflected by the alignment marks MK1b and MK2b on the substrates 301 and 302, proceeds downward, is transmitted through the window 503, is reflected by the mirror 505, and is incident on the imaging element of the second imager 502. In this way, the position measurer 500 acquires a captured image GAa including the alignment marks MK1a and MK2a on the two substrates 301 and 302 and a captured image GAb including the alignment marks MK1b and MK2b on the two substrates 301 and 302, as illustrated in FIGS. 6A and 6B. Note that image capturing operation of the captured image GAa performed by the first imager 501 and image capturing operation of the captured image GAb performed by the second imager 502 are performed substantially at the same time.

Returning to FIG. 1, the substrate heaters 481 and 482 are, for example, electrothermal heaters and are disposed in the stage 401 and the head 402, respectively, as illustrated in FIG. 3B. The substrate heaters 481 and 482 transfer heat to the substrates 301 and 302 supported by the stages 401 and 402 and thereby heat the substrates 301 and 302, respectively. Controlling the amount of heat generation by the substrate heaters 481 and 482 enables temperature of the substrates 301 and 302 and the bonding surfaces thereof to be controlled, respectively.

The substrate heaters 481 and 482 are connected to a heater driver 483, as illustrated in FIG. 4. The heater driver 483 supplies the substrate heaters 481 and 482 with current and thereby makes the substrate heaters 481 and 482 generate heat, based on a control signal input from the controller 700. Note that, in the case of placing importance on improvement in throughput of substrate bonding process, it is preferable to perform the heat treatment of the substrates 301 and 302 in another annealing device that is different from the substrate bonding device 100.

The controller 700 includes a micro processing unit (MPU) (not illustrated), a main storage (not illustrated), an auxiliary storage (not illustrated), and an interface (not illustrated). The main storage is constituted by a volatile memory and is used as a working area for the MPU. The auxiliary storage is constituted by a nonvolatile memory and stores programs that the MPU executes. The auxiliary storage also includes a parameter storage 703 that stores preset misalignment amount threshold values $\Delta$xth, $\Delta$yth, and $\Delta\theta$th for calculated relative misalignment amounts $\Delta$x, $\Delta$y, and $\Delta\theta$ between the substrates 301 and 302, which will be described later. The parameter storage 703 also stores information indicating pulse widths and pulse intervals of pulse voltages, which will be described later, that are applied to the electrostatic chucks 441 and 442 when holding of the peripheral portions of the substrates 301 and 302 by the electrostatic chucks 441 and 442 are released, respectively.

The controller 700 converts measurement signals that are input from the first pressure sensors 412, the second pressure sensor 408, and the distance measurer 490 to measurement information and acquires the measurement information. The controller 700 also converts captured image signals that are input from the first imager 501 and the second imager 502 to captured image information and acquires the captured image information. Further, the controller 700, by reading programs stored in the auxiliary storage into the main storage and executing the programs, respectively outputs control signals to the holder driver 443, the piezo-actuators 411, the first pressing driver 431b, the second pressing driver 432b, the heater driver 483, the stage driver 403, and the head driver 404.

The controller 700 calculates misalignment amounts $\Delta$xa and $\Delta$ya between a pair of alignment marks MK1a and MK2a, which are disposed on the substrates 301 and 302, respectively, based on the captured image GAa acquired from the first imager 501, as illustrated in FIG. 6B. Note that FIG. 6B illustrates a state in which the pair of alignment marks MK1a and MK2a are misaligned from each other. Similarly, the controller 700 calculates misalignment amounts $\Delta$xb and $\Delta$yb between the other pair of alignment marks MK1b and MK2b, which are disposed on the substrates 301 and 302, respectively, based on the captured image GAb acquired from the second imager 502. Subsequently, based on the misalignment amounts $\Delta$xa, $\Delta$ya, $\Delta$xb, and $\Delta$yb of the two pairs of alignment marks and a geometric relationship between the two pairs of marks, the controller 700 calculates relative misalignment amounts $\Delta$x, $\Delta$y, and $\Delta\theta$ in the X-direction, the Y-direction, and the rotational direction about the Z-axis between the two substrates 301 and 302. The controller 700 makes the head 402 move in the X-direction and the Y-direction or rotate about the Z-axis in such a way that the calculated misalignment amounts $\Delta$x, $\Delta$y, and $\Delta\theta$ are reduced. This control causes the relative misalignment amounts $\Delta$x, $\Delta$y, and $\Delta\theta$ between the two substrates 301 and 302 to be reduced. In this way, the substrate bonding device 100 performs the fine alignment operation that corrects the misalignment amounts Δx, Δy, and Δθ in horizontal directions between the two substrates 301 and 302.

Next, a substrate bonding process that the substrate bonding device 100 according to the present embodiment performs will be described, referring to FIGS. 7 to 10. The substrate bonding process is started, triggered by a program for performing the substrate bonding process being started up by the controller 700. Note that, in FIG. 7, it is assumed that the substrates 301 and 302 are supported by the stage 401 and the head 402, respectively. In this state, the controller 700 makes the holder driver 443 apply voltage to the electrostatic chucks 441, 442, 451, 452, 461, and 462 and thereby drive the electrostatic chucks 441, 442, 451, 452, 461, and 462. This processing causes the electrostatic chucks 441, 451, and 461 to be in a state of holding the substrate 301 and the electrostatic chucks 442, 452, and 462 to be in a state of holding the substrate 302. It is also assumed that the substrate bonding device 100 has completed measurement of distance between the upper surface of the stage 401 and the under surface of the head 402 while the substrates 301 and 302 are not held by the stage 401 and the head 402, respectively, by use of the distance measurer 490 and has stored a result of the measurement in the parameter storage 703. It is further assumed that measurement results of thicknesses of the substrates 301 and 302 have already been stored in the parameter storage 703.

First, the substrate bonding device 100 calculates a distance between the substrates 301 and 302, based on the distance between the upper surface of the stage 401 and the under surface of the head 402 while the substrates 301 and 302 are not held by the stage 401 and the head 402, respectively, and the thicknesses of the substrates 301 and 302. The substrate bonding device 100 moves the head 402 downward based on the calculated distance and thereby makes the substrates 301 and 302 come close to each other (step S1).

Figure 8A:
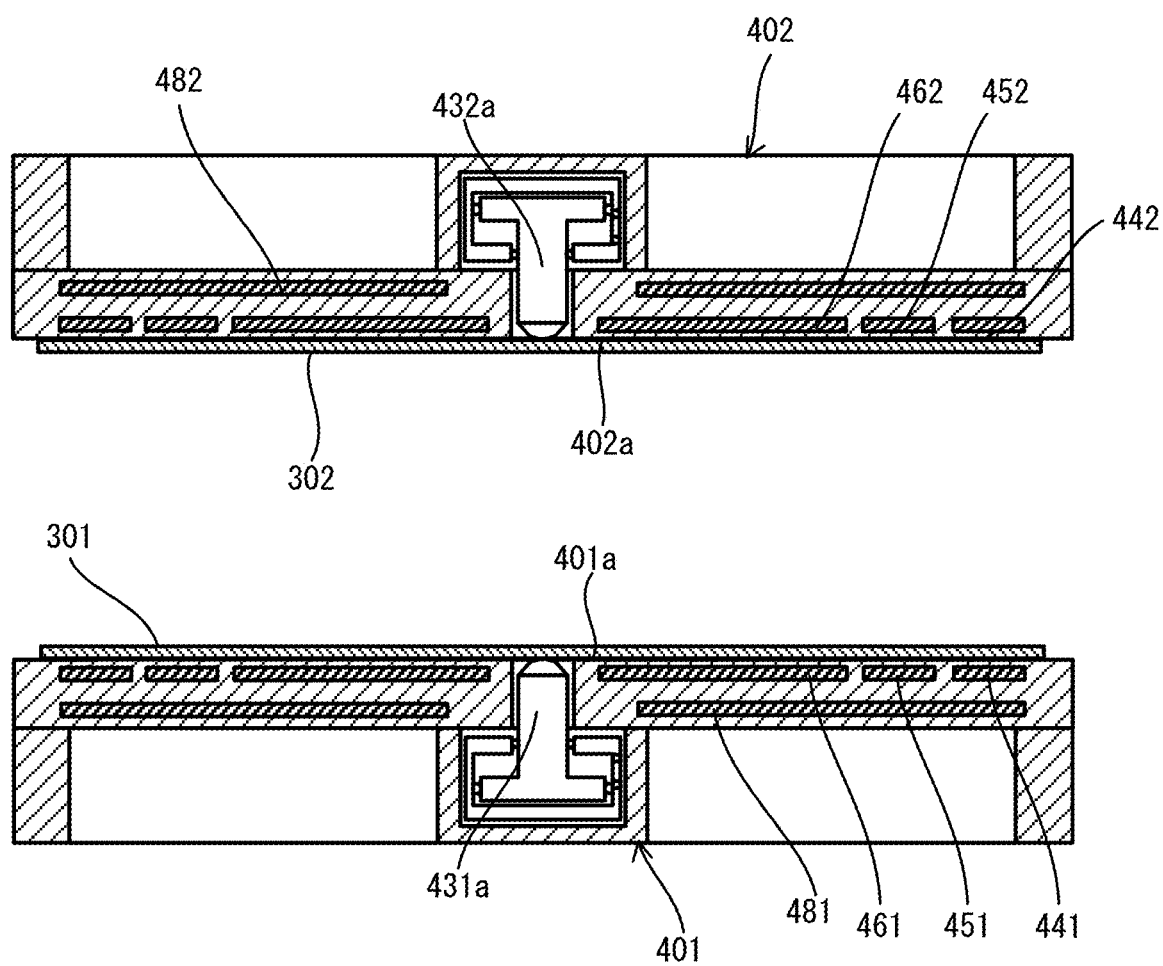
FIG. 8A is a schematic cross-sectional view illustrating a state in which substrates are held by the stage and the head according to Embodiment 1.

Next, the substrate bonding device 100 calculates misalignment amounts of the substrate 301 with respect to the substrate 302 while the substrates 301 and 302 are separated from each other as illustrated in FIG. 8A (step S2). In this processing, the controller 700 first acquires captured images GAa and GAb (see FIG. 6A) of the two substrates 301 and 302 in the non-contact state from the first imager 501 and the second imager 502 in the position measurer 500. The controller 700 respectively calculates misalignment amounts Δx, Δy, and Δθ in the X-direction, the Y-direction, and the rotational direction about the Z-axis between the two substrates 301 and 302, based on the two captured images GAa and GAb. Specifically, the controller 700, for example, calculates misalignment amounts Δxa and Δya (see FIG. 6B), using a vector correlation method, based on the captured image GAa in which the alignment marks MK1a and MK2a, which are separated from each other in the Z-direction, are captured. Similarly, the controller 700 calculates misalignment amounts Δxb and Δyb, using the vector correlation method, based on the captured image GAb in which the alignment marks MK1b and MK2b, which are separated from each other in the Z-direction, are captured. The controller 700 calculates misalignment amounts Δx, Δy, and Δθ in horizontal directions between the two substrates 301 and 302, based on the misalignment amounts Δxa, Δya, Δxb, and Δyb.

Returning to FIG. 7, the substrate bonding device 100 subsequently performs position alignment by relatively moving the substrate 302 with respect to the substrate 301 in such a way as to correct the calculated misalignment amounts Δx, Δy, and Δθ (step S3). In this processing, the substrate bonding device 100 moves the head 402 in the X-direction, Y-direction, and the rotational direction about the Z-axis in such a way as to eliminate the misalignment amounts Δx, Δy, and Δθ while the stage 401 is fixed.

Figure 8B:
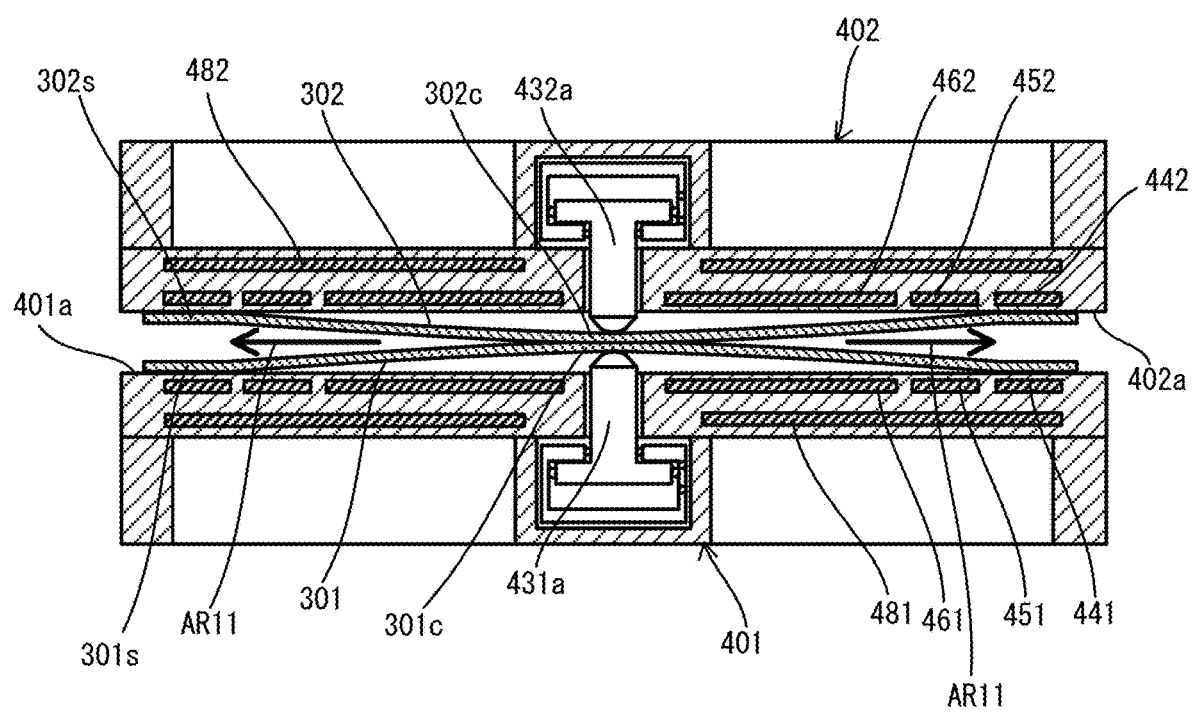
FIG. 8B is a schematic cross-sectional view illustrating a state in which central portions of bonding surfaces of the substrates held by the stage and the head according to Embodiment 1 are made to come into contact with each other.

Subsequently, the substrate bonding device 100 bows the substrates 301 and 302 while the substrates 301 and 302 are separated from each other (step S4). The substrate bonding device 100, for example, bows the substrate 301 in such a manner that a central portion 301c of the bonding surface of the substrate 301 protrudes to the substrate 302 side with respect to a peripheral portion 301s thereof, as illustrated in FIG. 8B. On this occasion, the substrate bonding device 100, while making the electrostatic chuck 441, which is located on the peripheral side on the stage 401, hold the substrate 301, releases holding of the substrate 301 by the electrostatic chucks 451 and 461, which are located on the central portion side on the stage 401. In this processing, the controller 700 controls the holder driver 443 in such a way that voltage is applied to the electrostatic chuck 441 from the holder driver 443 and no voltage is applied to the electrostatic chucks 451 and 461 from the holder driver 443. The substrate bonding device 100 makes the first pressing rod 431a press the central portion of the substrate 301 to the substrate 302 side while the peripheral portion 301s of the substrate 301 is held by the electrostatic chuck 441. This processing causes the substrate 301 to be bowed in such a way that the central portion 301c of the bonding surface thereof protrudes to the substrate 302 side.

The substrate bonding device 100 bows the substrate 302 in such a manner that a central portion 302c of the bonding surface of the substrate 302 protrudes to the substrate 301 side with respect to a peripheral portion 302s thereof. On this occasion, the substrate bonding device 100, while making the electrostatic chuck 442, which is located on the peripheral side on the head 402, hold the substrate 302, releases holding of the substrate 302 by the electrostatic chucks 452 and 462, which are located on the central portion side on the head 402. In this processing, the controller 700 controls the holder driver 443 in such a way that voltage is applied to the electrostatic chuck 442 from the holder driver 443 and no voltage is applied to the electrostatic chucks 452 and 462 from the holder driver 443. The substrate bonding device 100 makes the second pressing rod 432a press the central portion of the substrate 302 to the substrate 301 side while the peripheral portion 302s of the substrate 302 is held by the electrostatic chuck 442. This processing causes the substrate 302 to be bowed in such a way that the central portion 302c of the bonding surface thereof protrudes to the substrate 301 side.

Returning to FIG. 7, next, the substrate bonding device 100 makes the ascent/descent driver 406 move the head 402 downward and thereby makes the central portion 301c of the bonding surface of the substrate 301 and the central portion 302c of the bonding surface of the substrate 302 come into contact with each other (step S5). On this occasion, as illustrated by arrows AR11 in FIG. 8B, bonding of the substrates 301 and 302 to each other advances from the central portions 301c and 302c of the respective bonding surfaces, which are bonded to each other, of the substrates 301 and 302 toward the peripheral portions of the substrates 301 and 302. In this processing, the controller 700 controls the holder driver 443 in such a way that voltage applied to the electrostatic chuck 442 of the head 402 is lower than voltage applied to the electrostatic chuck 441 of the stage

401. In this case, while force with which the substrate 302 is electrostatically adsorbed on the electrostatic chuck 442 and bonding force bonding the substrates 301 and 302 to each other balance with each other, the bonding of the substrates 301 and 302 to each other advances.

Figure 9A:
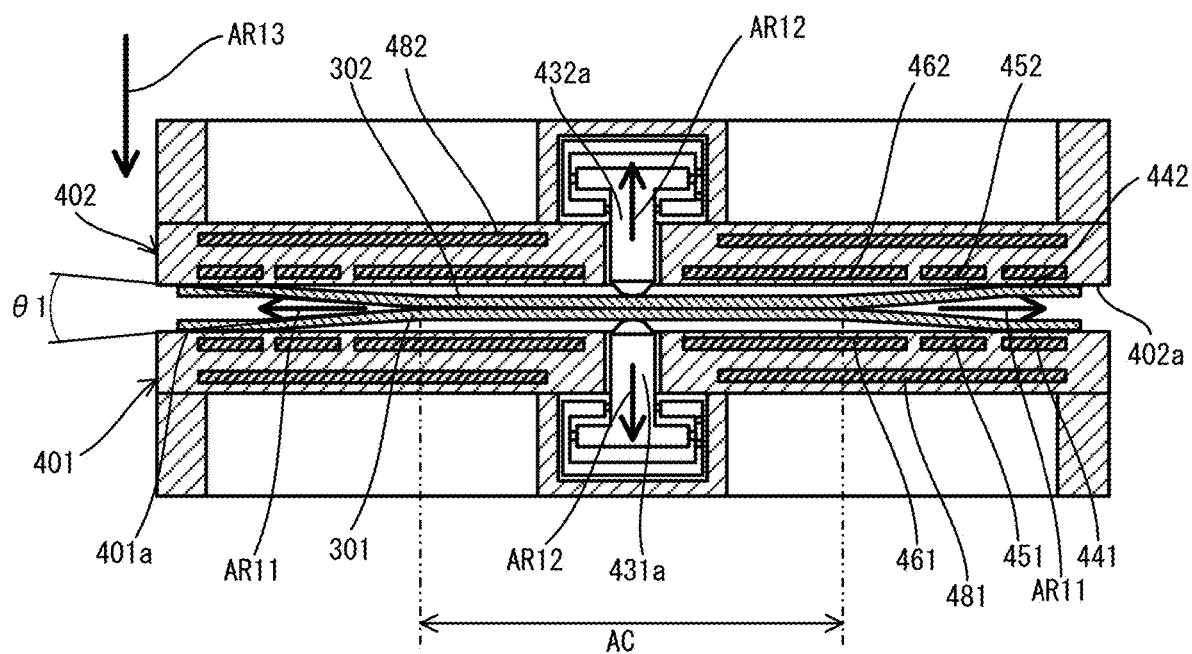
FIG. 9A is a schematic cross-sectional view illustrating a situation in which the substrates held by the stage and the head according to Embodiment 1 are made to come close to each other.

The substrate bonding device 100 makes the first pressing rod 431*a* move in a direction in which the first pressing rod 431*a* is retracted into the stage 401 and makes the second pressing rod 432*a* move in a direction in which the second pressing rod 432*a* is retracted into the head 402, as illustrated by arrows AR12 in FIG. 9A. At the same time, the substrate bonding device 100 makes the head 402 move in a direction in which the head 402 comes close to the stage 401, as illustrated by an arrow AR13 in FIG. 9A. In this processing, the substrate bonding device 100 drives the stage 401 and the head 402 in such a way that an angle θ1 made by the bonding surface of the substrate 301 and the bonding surface of the substrate 302 at the periphery of a contact area AC between the substrates 301 and 302 is equal to or less than a preset reference angle. Note that the reference angle is set at, for example, 45 degrees, and preferably set at equal to or less than 15 degrees. This configuration causes distortion generated at the peripheral portion of the contact area AC between the substrates 301 and 302 at the time of contact of the substrates 301 and 302 with each other to be mitigated. Note that, on this occasion, the substrate 301 and the substrate 302 are in a so-called temporarily bonded state in which the substrate 301 and the substrate 302 are bonded while being separable from each other. The reference angle is set based on bonding force bonding the substrates 301 and 302 to each other while the substrates 301 and 302 are in the temporarily bonded state, adsorption force with which the electrostatic chucks 451 and 452 and the electrostatic chuck 461 and 462 electrostatically adsorb the substrates 301 and 302, respectively, and peel force that is required to peel the substrates 301 and 302 from the stage 401 and the head 402, respectively. Note that the afore-described bonding force, adsorption force, and peel force are required to be measured in advance before bonding processing of bonding the substrates 301 and 302 to each other is performed.

Returning to FIG. 7, subsequently, the substrate bonding device 100 measures misalignment amounts of the substrate 301 with respect to the substrate 302 while the bonding surface of the substrate 301 and the bonding surface of the substrate 302 are in contact with each other (step S6). On this occasion, the substrate bonding device 100 measures misalignment amounts between the substrates 301 and 302 while movement of the substrate 302 with respect to the substrate 301 is restricted by advancing temporary bonding between the substrate 301 and the substrate 302.

Subsequently, the substrate bonding device 100 determines whether or not all of the calculated misalignment amounts Δx, Δy, and Δθ are equal to or less than preset misalignment amount threshold values Δxth, Δyth, and Δθth, respectively (step S7).

Next, it is assumed that it is determined by the substrate bonding device 100 that one of the calculated misalignment amounts Δx, Δy, and Δθ is greater than corresponding one of the preset misalignment amount threshold values Δxth, Δyth, and Δθth (step S7: No). In this case, the substrate bonding device 100 separates the bonding surface of the substrate 302 from the bonding surface of the substrate 301 (step S8). On this occasion, the substrate bonding device 100, while making the head 402 ascend and thereby widening a gap between the substrates 301 and 302, makes the first pressing rod 431*a* move in a direction in which the first pressing rod 431*a* is retracted into the stage 401 and, in conjunction therewith, makes the second pressing rod 432*a* move in a direction in which the second pressing rod 432*a* is retracted into the head 402. In this processing, the substrate bonding device 100 controls ascent of the head 402 in such a way that tensile pressure on the substrate 302 at the time of peeling the substrate 302 from the substrate 301 is constant. In addition, the substrate bonding device 100 makes the electrostatic chucks 451 and 461 on the central portion side on the stage 401 and the electrostatic chucks 452 and 462 on the central portion side on the head 402 hold the central portions of the substrates 301 and 302, respectively. In this processing, a timing at which the substrate bonding device 100 makes the electrostatic chucks 451, 452, 461, and 462 hold the substrates 301 and 302 may be a timing around or the same timing as a timing at which the substrate bonding device 100, while widening the gap between the substrates 301 and 302, makes the first pressing rod 431*a* retract into the stage 401 and the second pressing rod 432*a* retract into the head 402. This configuration causes the substrate 302 to be separated from the substrate 301 and the contact state between the substrate 301 and the substrate 302 to be released.

Subsequently, the substrate bonding device 100 calculates correction movement amounts of the substrates 301 and 302 required to decrease all of the calculated misalignment amounts Δx, Δy, and Δθ to the misalignment amount threshold values Δxth, Δyth, and Δθth or less, respectively (step S9). In this step, the controller 700 calculates correction movement amounts that cause the substrates 301 and 302 to relatively move by movement amounts that are equivalent to differences between the misalignment amounts Δx, Δy, and Δθ between the substrate 301 and the substrate 302 while the substrate 302 is in contact with the substrate 301 and misalignment amounts between the substrate 301 and the substrate 302 while the substrate 302 is not in contact with the substrate 301. Aligning the substrates 301 and 302 with the positions thereof offset from each other by the movement amounts equivalent to differences between misalignment amounts while the substrates 301 and 302 are in contact with each other and misalignment amounts while the substrates 301 and 302 are not in contact with each other enables misalignment between the substrates 301 and 302 to be eliminated if similar misalignment caused by contact of the substrates 301 and 302 with each other occurs when the substrates 301 and 302 come into contact with each other again.

Subsequently, the substrate bonding device 100 performs position alignment in such a way as to correct the relative misalignment amounts Δx, Δy, and Δθ between the two substrates 301 and 302 when the two substrates 301 and 302 are in a non-contact state, that is, a state in which the two substrates 301 and 302 are freely movable in horizontal directions (step S10). In this processing, the substrate bonding device 100 moves the head 402 in the X-direction, the Y-direction, and the rotational direction about the Z-axis by the correction movement amounts calculated in step S9 while the stage 401 is fixed. In this way, the substrate bonding device 100 adjusts the relative position of the substrate 301 with respect to the substrate 302 in such a way that the misalignment amounts Δx, Δy, and Δθ decrease while the bonding surface of the substrate 301 and the bonding surface of the substrate 302 are separated from each other. Subsequently, the substrate bonding device 100 performs the processing in step S4 again.

Figure 9B:
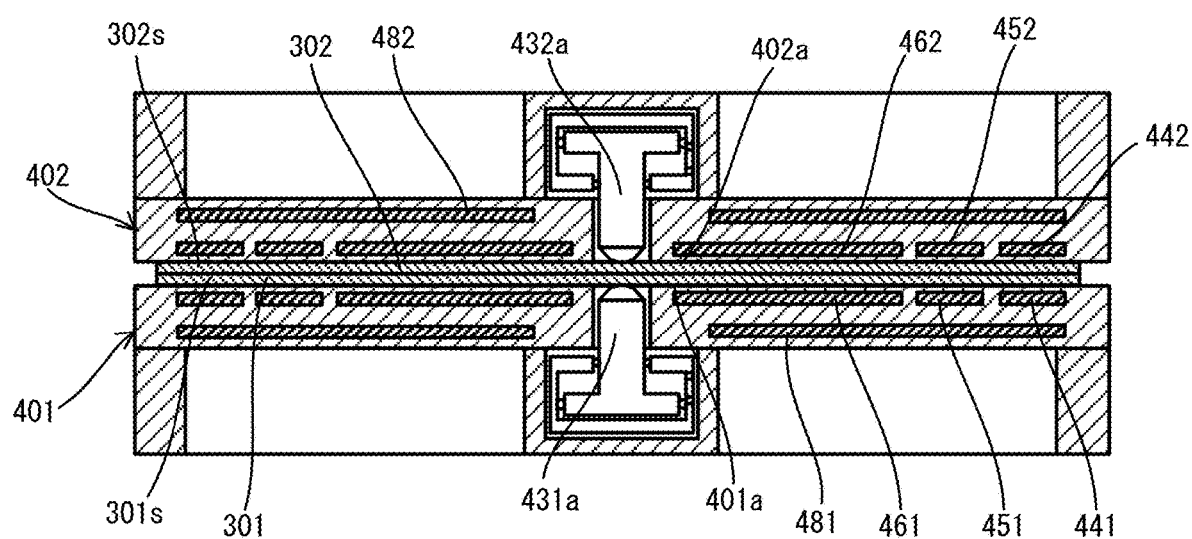
FIG. 9B is a schematic cross-sectional view illustrating a state in which peripheral portions of bonding surfaces of the substrates held by the stage and the head according to Embodiment 1 are made to come into contact with each other.
Figure 9C:
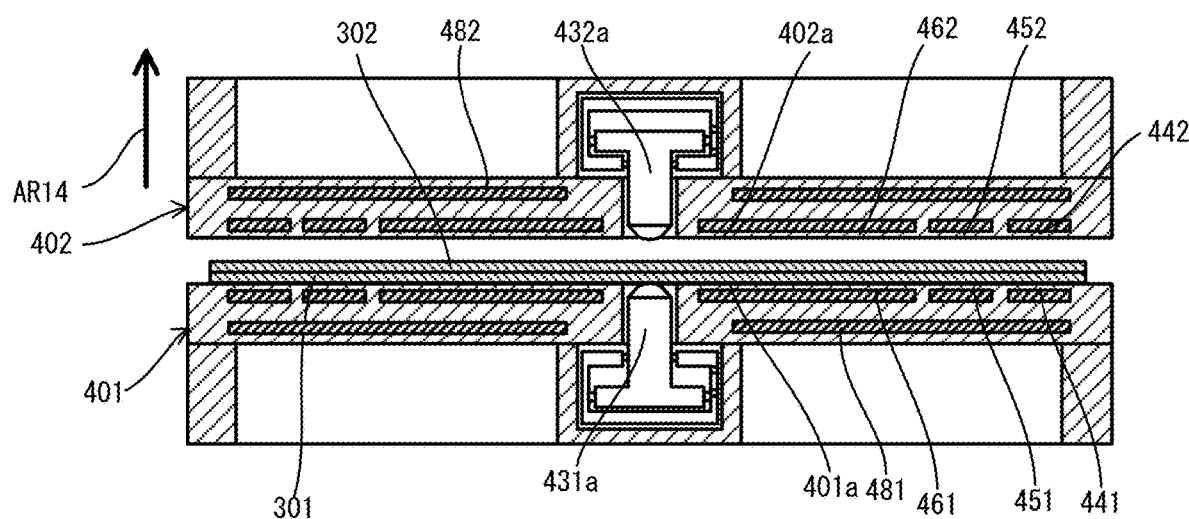
FIG. 9C is a schematic cross-sectional view illustrating a situation in which the head according to Embodiment 1 is released from the stage according to Embodiment 1.

On the other hand, it is assumed that it is determined by the substrate bonding device 100 that all of the calculated misalignment amounts Δx, Δy, and Δθ are equal to or less than the preset misalignment amount threshold values Δxth, Δyth, and Δθth, respectively (step S7: Yes). In this case, the substrate bonding device 100 releases holding of the peripheral portions of the substrates 301 and 302 (step S11). In this step, the substrate bonding device 100 makes the peripheral portion 301s of the substrate 301 come into contact with the peripheral portion 302s of the substrate 302, as illustrated in FIG. 9B. The substrate bonding device 100 makes the electrostatic chucks 441 and 442 release holding of the peripheral portions of the substrates 301 and 302, respectively. In this processing, the controller 700 controls the holder driver 443 to make the electrostatic chucks 441 and 442 release holding of the peripheral portions 301s and 302s of the substrates 301 and 302, respectively. In other words, the controller 700 controls the holder driver 443 to stop voltage application to the electrostatic chucks 441 and 442 from the holder driver 443. In this way, the substrate bonding device 100 makes the peripheral portion of the substrate 301 come into contact with the peripheral portion of the substrate 302 and thereby bonds together the bonding surface of the substrate 301 and the bonding surface of the substrate 302 over the whole surfaces.

Figure 10:
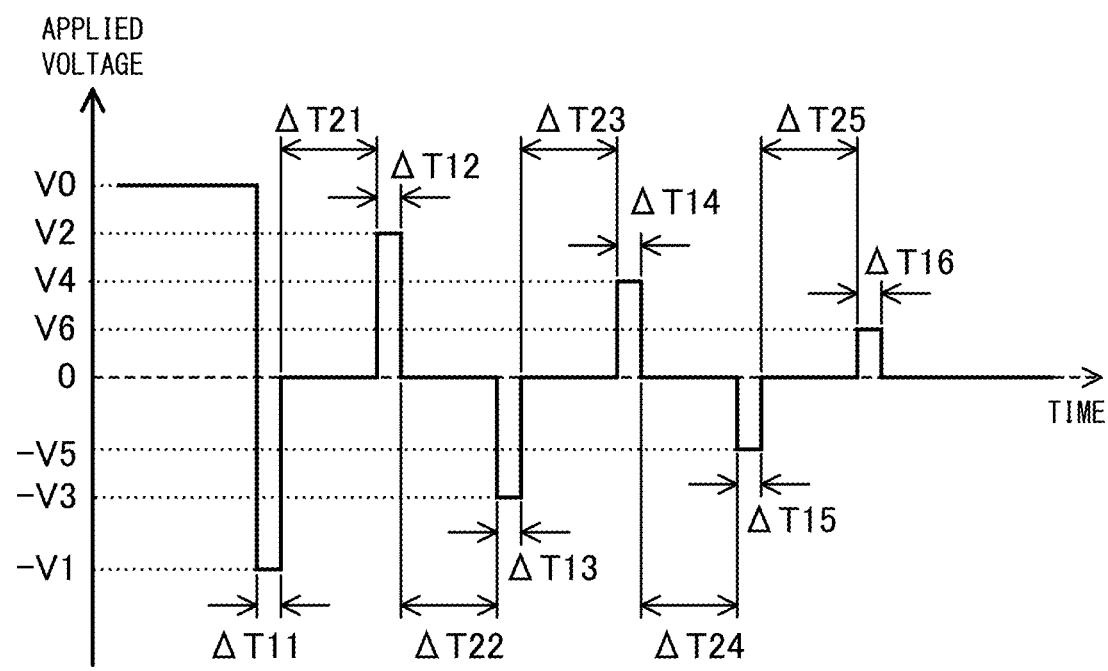
FIG. 10 is a timing diagram illustrating transition of voltage that a holder driver according to Embodiment 1 applies to an electrostatic chuck according to Embodiment 1 when a peripheral portion of a substrate is released from the electrostatic chuck.

When the controller 700 makes the electrostatic chucks 441 and 442 release holding of the peripheral portions of the substrates 301 and 302, the controller 700 controls the holder driver 443 to apply pulse voltages between the terminal electrodes 441a and 442a and the terminal electrodes 441b and 442b of the electrostatic chucks 441 and 442, respectively. In this processing, the controller 700 controls the holder driver 443 to, while alternately applying pulse voltages the polarities of which are different from each other between the terminal electrodes 441a and 441b and between the terminal electrodes 442a and 442b, gradually decrease the amplitudes of the pulse voltages. The holder driver 443, for example, alternately applies pulse voltages the polarities of which are different from each other and the pulse widths of which are ΔT11, ΔT12, ΔT13, ΔT14, ΔT15, and ΔT16, as illustrated in FIG. 10. Pulse intervals between the successive pulse voltages are respectively set as ΔT21, ΔT22, ΔT23, ΔT24, and ΔT25. The respective pulse intervals ΔT21, ΔT22, ΔT23, ΔT24, and ΔT25 are determined in consideration of discharge time of the stage 401 and the head 402. When, as in the electrostatic chucks 441, 442, 451, 452, 461, and 462 according to the present embodiment, a plurality of electrode elements is arranged in such a manner as to be alternately lined up, electrostatic charge is likely to be discharged and electrostatic charge suppression effect for the stage 401 and the head 402 enabled by setting the pulse intervals ΔT21, ΔT22, ΔT23, ΔT24, and ΔT25 can be achieved. The pulse widths ΔT11, ΔT12, ΔT13, ΔT14, ΔT15, and ΔT16 may be set equal to one another or set to become longer over time. Alternatively, the pulse widths ΔT11, ΔT12, ΔT13, ΔT14, ΔT15, and ΔT16 may be set in such a way that the pulse widths of five or less arbitrarily chosen pulse voltages are equal to one another. Further, the pulse intervals ΔT21, ΔT22, ΔT23, ΔT24, and ΔT25 may be set equal to one another or set to become longer over time. Alternatively, the pulse intervals ΔT21, ΔT22, ΔT23, ΔT24, and ΔT25 may be set in such a way that four or less arbitrarily chosen pulse intervals are equal to one another. Note that, in FIG. 10, V0, V1, V2, V3, V4, V5, and V6 indicate absolute values of voltage amplitudes, and V0 is equivalent to a voltage amplitude when the substrates 301 and 302 are held by the electrostatic chucks 441 and 442, respectively. Note also that a relationship V0>V1>V2>V3>V4>V5>V6 holds.

Returning to FIG. 7, next, the substrate bonding device 100 performs bonding processing of bonding the substrates 301 and 302 to each other (step S12). In this processing, the substrate bonding device 100 bonds the substrate 301 and the substrate 302 to each other by making the substrate heaters 481 and 482 heat the substrates 301 and 302, respectively. Subsequently, the substrate bonding device 100 makes the head 402 ascend, as illustrated by an arrow AR14 in FIG. 9C.

When bonding of the substrates 301 and 302 to each other is performed multiple times, the substrate bonding device 100 reverses the polarities of voltages that are applied between the terminal electrodes 441a and 442a and the terminal electrodes 441b and 442b while the electrostatic chucks 441 and 442 hold the substrates 301 and 302, respectively, at every preset reference number of times. Specifically, the controller 700 controls the holder driver 443 to reverse the polarities of the voltages applied between the terminal electrodes 441a and 442a and the terminal electrodes 441b and 442b while the terminal electrodes 441a and 441b and the terminal electrodes 442a and 442b hold the substrates 301 and 302, respectively, at every reference number of times. In this processing, the reference number of times is set in such a way that the amounts of electrostatic charge on the stage 401 and the head 402 are maintained at an amount that does not influence the bonding of the substrates 301 and 302 to each other and may be set at one or set at two or more. When the reference number of times is set at one, the substrate bonding device 100 reverses the polarities of voltages applied between the terminal electrodes 441a and 441b and between the terminal electrodes 442a and 442b every time a pair of substrates 301 and 302 are bonded. Note that, in respect of the electrostatic chucks 451, 452, 461, and 462, the substrate bonding device 100 also reverses the polarities of voltages that are applied between the terminal electrodes 451a and 452a and the terminal electrodes 451b and 452b and between the terminal electrodes 461a and 462a and the terminal electrodes 461b and 462b while the electrostatic chucks 451 and 452 and the electrostatic chucks 461 and 462 hold the substrates 301 and 302, respectively, at every preset reference number of times. Since this processing causes the amount of electrostatic charge on the stage 401 and the head 402 to be reduced, sticking of the substrates 301 and 302 on the stage 401 and the head 402 caused by the stage 401 and the head 402 being electrostatically charged is suppressed, respectively.

As described in the foregoing, according to the substrate bonding device 100 according to the present embodiment, when the controller 700 makes the peripheral portion 301s of the substrate 301 come into contact with the peripheral portion 302s of the substrate 302 while the central portion 301c of the substrate 301 and the central portion 302c of the substrate 302 are in contact with each other by bowing the substrates 301 and 302, the controller 700 controls the holder driver 443 to release holding of the peripheral portion 301s of the substrate 301 by the electrostatic chucks 441 and 442. When, after the substrates 301 and 302 have been bowed and the central portion 301c of the substrate 301 and the central portion 302c of the substrate 302 have thereby been made to come into contact with each other, the peripheral portion 301s of the substrate 301 is made to come into contact with the peripheral portion 302s of the substrate 302, this configuration enables sticking of a portion on the inner side of the peripheral portion 301s of the substrate 301 on the stage 401 and sticking of a portion on the inner side of the peripheral portion 302s of the substrate 302 on the head 402 to be suppressed and sticking of the peripheral portion 301s of the substrate 301 on the stage 401 and sticking of the peripheral portion 302s of the substrate 302 on the head 402 to be suppressed. Therefore, it is possible to avoid bonding of the substrates 301 and 302 to each other while distortion is generated in the substrate 301 and to bond the substrates 301 and 302 to each other without distortion, over the whole surfaces, and with high positional precision.

Figure 11:
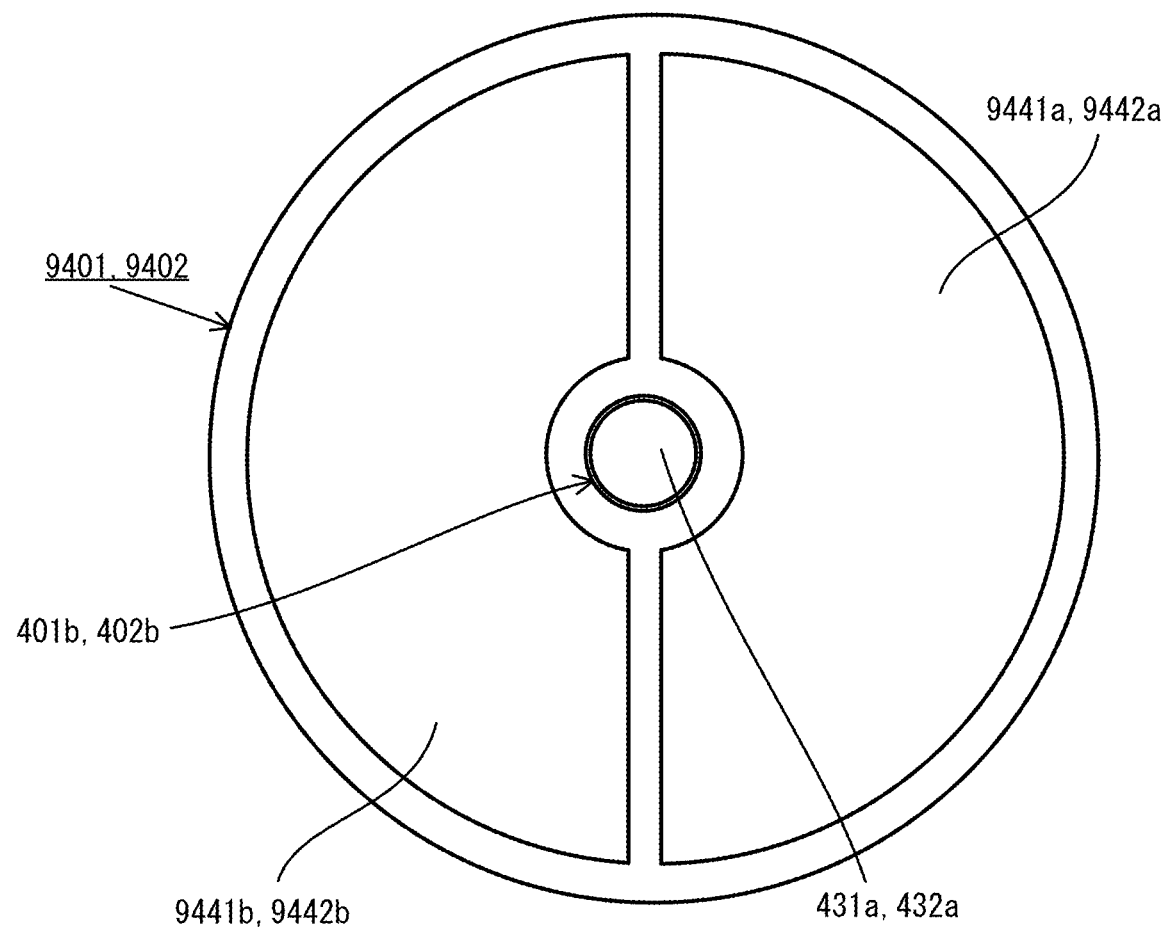
FIG. 11 is a schematic plan view of a stage and a head according to a comparative example.

As electrostatic chucks, a configuration that, for example, includes electrodes 9441a and 9441b and electrodes 9442a and 9442b that are disposed on both sides sandwiching through-holes 401b and 402b as viewed in plan on a stage 9401 and a head 9402, respectively, as in a comparative example illustrated in FIG. 11, is conceivable. In this case, biases of electric charge in the stage 9401 and the head 9402 while the electrostatic chucks 9441 and 9442 hold the substrates 301 and 302, respectively, increase. Therefore, when holding of the substrates 301 and 302 by the electrostatic chucks 9441 and 9442 is released, the large biases of electric charge in the stage 9401 and the head 9402 make it difficult to eliminate the biases of electric charge even when voltage application between the electrodes 9441a and 9442a and the electrodes 9441b and 9442b is stopped, respectively. This phenomenon causes the amount of electrostatic charge on the stage 9401 and the head 9402 to increase, and there is thus a possibility that the substrates 301 and 302 do not separate from the stage 9401 and the head 9402 and are kept stuck on the stage 9401 and the head 9402, respectively.

In contrast, in the substrate bonding device 100 according to the present embodiment, the pluralities of electrode elements 441c and 442c and the pluralities of electrode elements 441d and 442d are arranged in such a manner as to be alternately lined up along the circumferential direction of the first areas A1 in the first areas A1 on the stage 401 and the head 402, respectively. In addition, the pluralities of electrode elements 451c and 452c and the pluralities of electrode elements 451d and 452d are arranged in such a manner as to be alternately lined up in a direction along the peripheries of the second areas A2, which is a second direction, in the second areas A2 on the stage 401 and the head 402, respectively. Further, the pluralities of electrode elements 461c and 462c and the pluralities of electrode elements 461d and 462d are arranged in such a manner as to be alternately lined up in the W-axis direction on the stage 401 and the head 402, respectively. Thus, distances between the electrode elements 441c and 441d, between the electrode elements 442c and 442d, between the electrode elements 451c and 451d, between the electrode elements 452c and 452d, between the electrode elements 461c and 461d, and between the electrode elements 462c and 462d are shorter than the comparative example. Since this configuration causes the stage 401 and the head 402 to easily discharge electrostatic charge when holding of the substrates 301 and 302 by the electrostatic chucks 441, 451, and 461 and the electrostatic chucks 442, 452, and 462 is released, sticking of the substrates 301 and 302 on the stage 401 and the head 402 caused by the stage 401 and the head 402 being electrostatically charged is suppressed, respectively.

Further, the controller 700 according to the present embodiment controls the holder driver 443 to, while alternately applying pulse voltages the polarities of which are different from each other between the terminal electrodes 441a and 441b, gradually decrease the amplitudes of the pulse voltages when holding of the peripheral portion of the substrate 301 by the electrostatic chuck 441 is released. In addition, the controller 700 controls the holder driver 443 to, while alternately applying pulse voltages the polarities of which are different from each other between the terminal electrodes 442a and 442b, gradually decrease the amplitudes of the pulse voltages when holding of the peripheral portion of the substrate 302 by the electrostatic chuck 442 is released. Since this configuration enables the amount of electrostatic charge on the substrates 301 and 302 to rapidly decrease, it is possible to smoothly separate the substrates 301 and 302 from the stage 401 and the head 402, respectively.

The stage 401 and the head 402 according to the present embodiment are formed of a glass having translucency. The terminal electrodes 441a, 441b, 442a, 442b, 451a, 451b, 452a, 452b, 461a, 461b, 462a, and 462b and the electrode elements 441c, 441d, 442c, 442d, 451c, 451d, 452c, 452d, 461c, 461d, 462c, and 462d are formed of a transparent conductive film containing a transparent conductive material. This configuration enables the distance measurer 490 to measure distance between the stage 401 and the head 402 from the opposite side of the stage 401 to the substrate 301 side thereof or the opposite side of the head 402 to the substrate 302 side thereof. In addition, the position measurer 500 is capable of measuring a relative misalignment amount between the substrates 301 and 302 from the opposite side of the stage 401 to the substrate 301 side thereof or the opposite side of the head 402 to the substrate 302 side thereof. Therefore, it is possible to increase a degree of freedom in arrangement of the distance measurer 490 and the position measurer 500. In the substrate bonding device 100 according to the present embodiment, the first imager 501 and the second imager 502 are arranged on the opposite side of the stage 401 to the side thereof on which the substrate 301 is supported. Since this configuration causes arrangement of an imager between the substrates 301 and 302 to be unnecessary, adherence of particles onto the substrates 301 and 302 is suppressed. When a method of recognizing the alignment marks MK1a and MK1b on the substrate 301 and the alignment marks MK2a and MK2b on the substrate 302 individually using different imagers is employed, the recognition is influenced by temporal change in, for example, thermal expansion, vibration, or distance between the two imagers. In contrast, employing a method of, as in the present embodiment, recognizing the alignment marks MK1a and MK2a simultaneously with the first imager 501 and the alignment marks MK1b and MK2b simultaneously with the second imager 502 by use of an infrared transmission method enables the positional precision of the substrates 301 and 302 to be improved.

A stage and a head that are configured by, in order to suppress sticking of the substrates 301 and 302 on the stage 401 and the head 402, disposing recesses (not illustrated) in the second areas A2 on the stage 401 and the head 402 and thereby reducing contact areas between the substrates 301 and 302 and the stages 401 and the head 402, respectively, are conceivable. However, when such a stage and a head are used, there is a possibility that the central portions of the substrates 301 and 302 are bowed in the directions toward the interiors of the recesses while the stage and the head support the substrates 301 and 302 and distortion is generated to the substrates 301 and 302, respectively. When the substrates 301 and 302 are bonded to each other while the substrates 301 and 302 are distorted, there is a possibility that a bonding defect occurs. In contrast, the stage 401 according to the present embodiment supports the substrate 301 while the upper surface 401a thereof is in surface contact with at least a portion of the substrate 301. In addition, the head 402 supports the substrate 302 while the under surface 402a thereof is in surface contact with at least a portion of the substrate 302. Since this configuration causes bowing of the substrates 301 and 302 while the substrates 301 and 302 are supported by the stage 401 and the head 402, respectively, to be reduced, occurrence of a defect on the bonding between the substrates 301 and 302 is suppressed.

Further, in the substrate bonding device 100 according to the present embodiment, the stage 401 and the head 402 support the substrates 301 and 302 by use of the electrostatic chucks 441, 451, and 461 and the electrostatic chucks 442, 452, and 462, respectively. Since this configuration enables the stage 401 and the head 402 to firmly support the substrates 301 and 302 even when the degree of vacuum inside the vacuum chamber 200 is high, the substrates 301 and 302 are prevented from falling off the stage 401 and the head 402, respectively.

Embodiment 2

Figure 12:
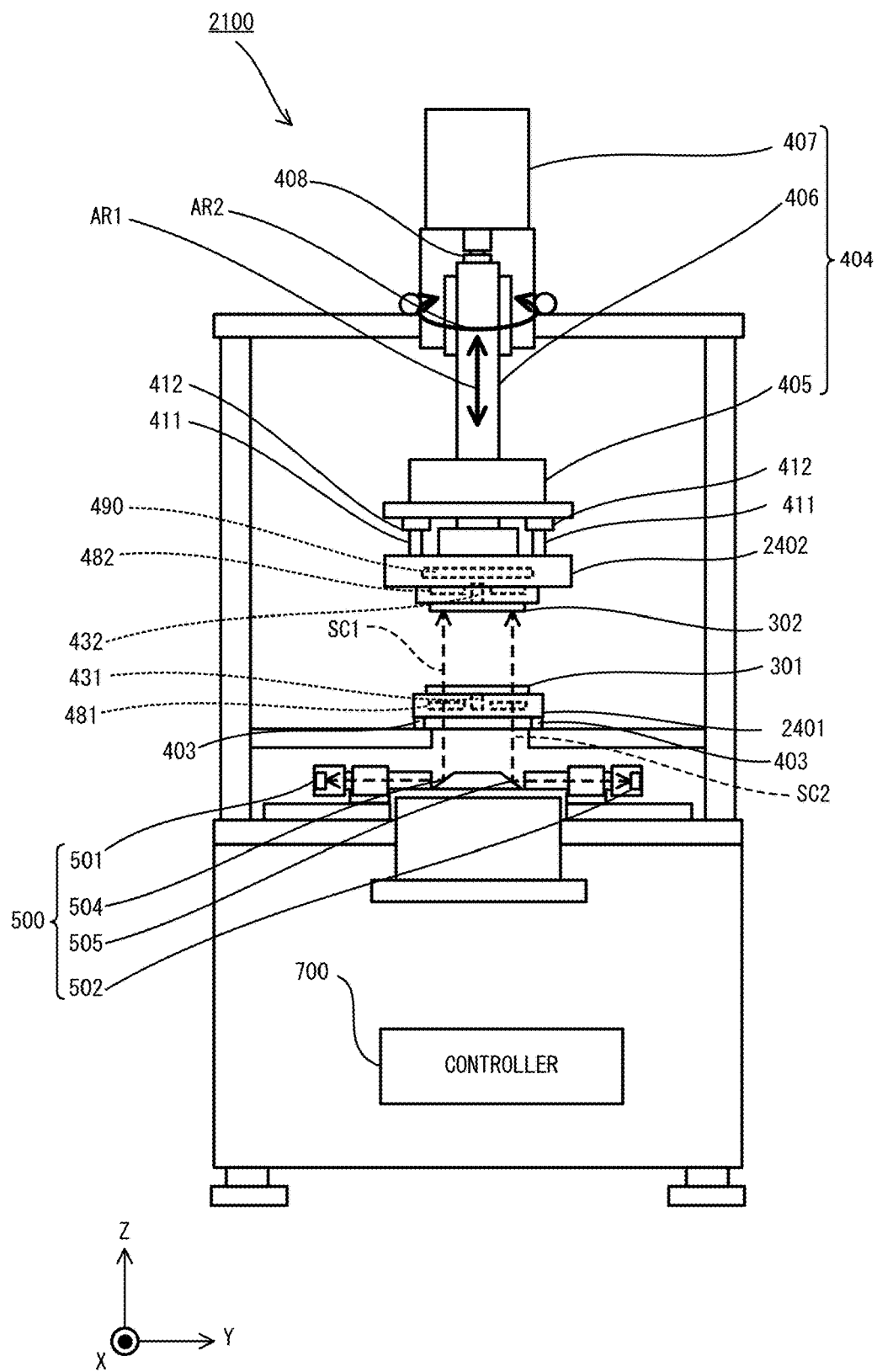
FIG. 12 is a schematic front view of a substrate bonding device according to Embodiment 2 of the present disclosure.

A substrate bonding device according to the present embodiment bonds two substrates 301 and 302 on the bonding surfaces of which, which are to be bonded to each other, activation treatment and hydrophilization treatment were performed, to each other by making the two substrates 301 and 302 come into contact with each other and pressurizing and heating the two substrates 301 and 302, under atmospheric pressure. As illustrated in FIG. 12, a substrate bonding device 2100 according to the present embodiment differs from the substrate bonding device 100 according to Embodiment 1 in that the substrate bonding device 2100 does not include a vacuum chamber. Note that, in FIG. 12, the same reference signs as those in FIG. 1 are assigned to the same constituent components as those in Embodiment 1. Note that, in the following description, constituent components of the substrate bonding device according to the present embodiment that are the same as those of the substrate bonding device 100 according to Embodiment 1 will be described using the same reference signs as the reference signs illustrated in FIGS. 1 to 9.

Figure 13A:
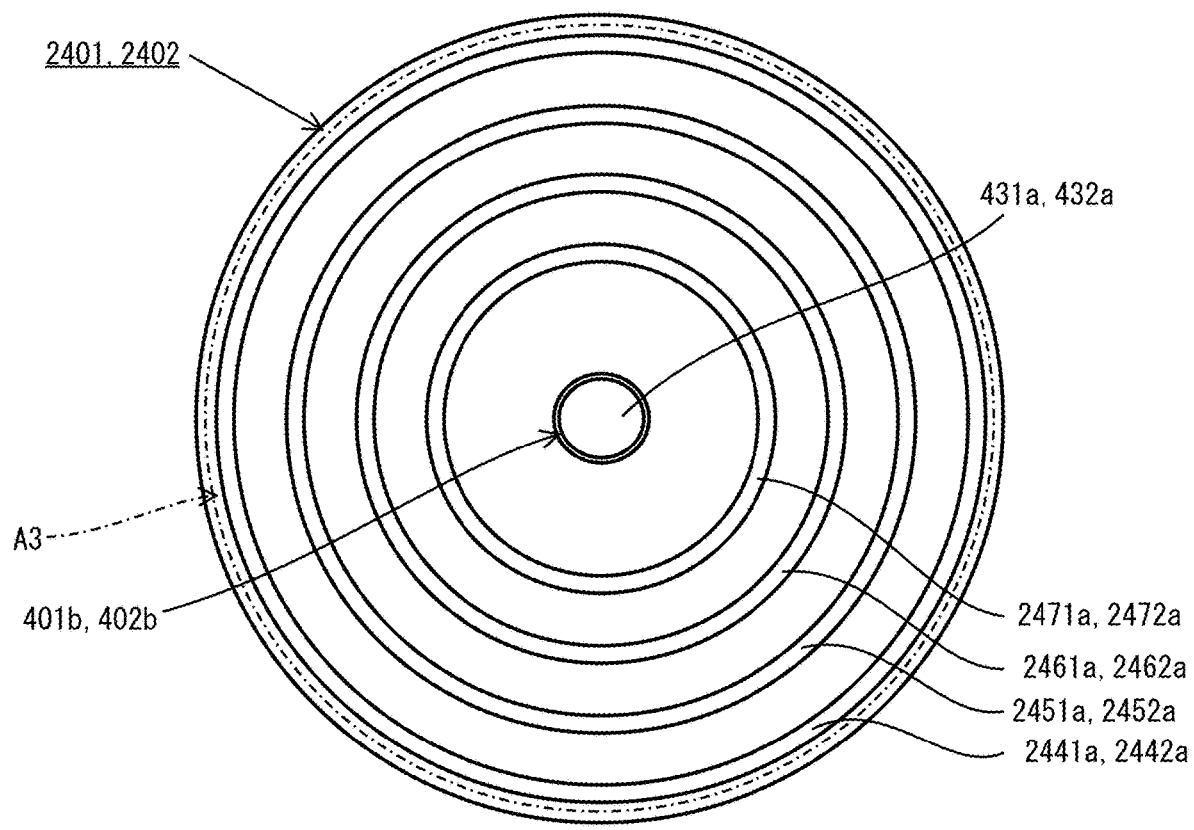
FIG. 13A is a schematic plan view of a stage and a head according to Embodiment 2.

A stage 2401 and a head 2402 are arranged to face each other in the vertical direction. The stage 2401 and the head 2402 are formed of a translucent material, such as glass having translucency. The stage 2401 and the head 2402 have substrate contact areas A3 that face the substrates 301 and 302 while the stage 2401 and the head 2402 support the substrates 301 and 302, respectively, as illustrated in FIG. 13A. Note that, in FIGS. 13A and 13B, the same reference signs as those in FIGS. 3A and 3B are assigned to the same constituent components as those in Embodiment 1. In the respective substrate contact areas A3 of the stage 2401 and the head 2402, irregularities 2401a and 2402a are, for example, formed as illustrated in FIG. 14. Arithmetic average roughness of the surface of each substrate contact area A3 is in a range of 0.1 µm to 1 mm.

Figure 15A:
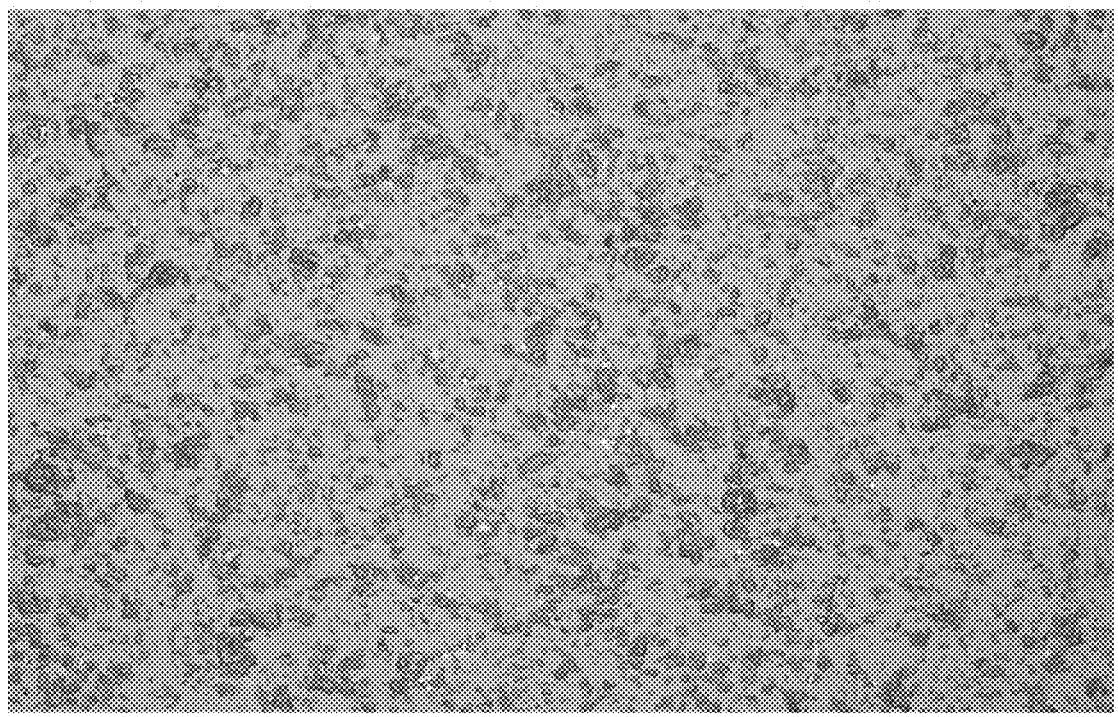
FIG. 15A is a partially enlarged photograph illustrating an example of a substrate contact area according to Embodiment 2.
Figure 15B:
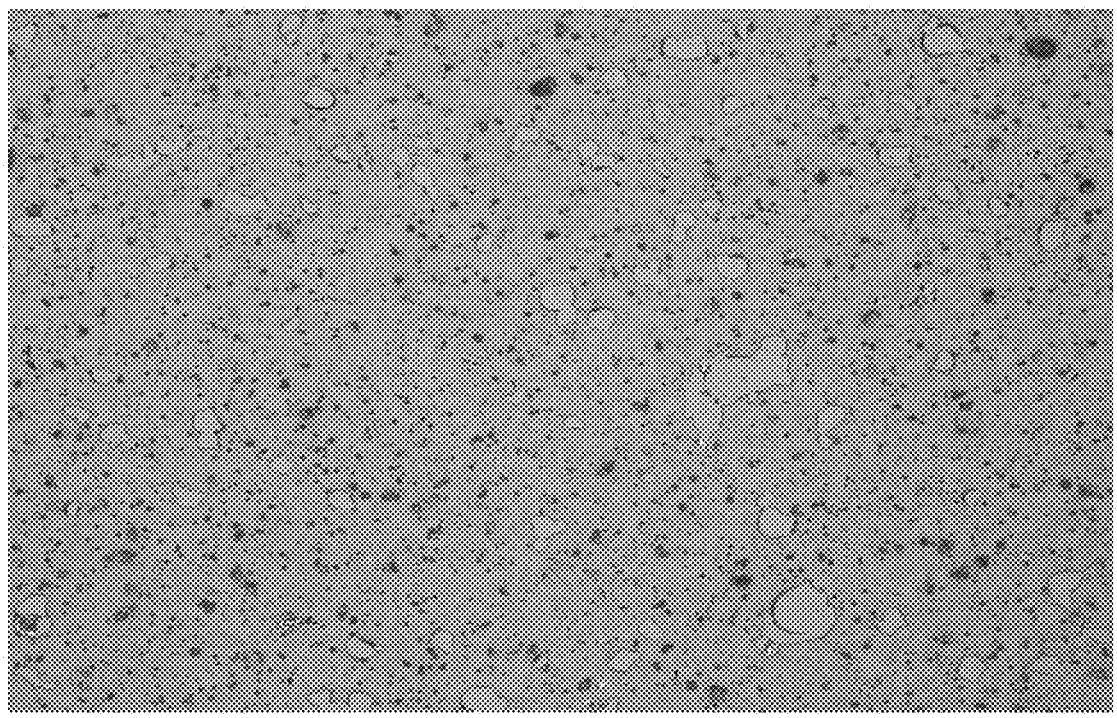
FIG. 15B is a partially enlarged photograph illustrating another example of the substrate contact area according to Embodiment 2.
Figure 16A:
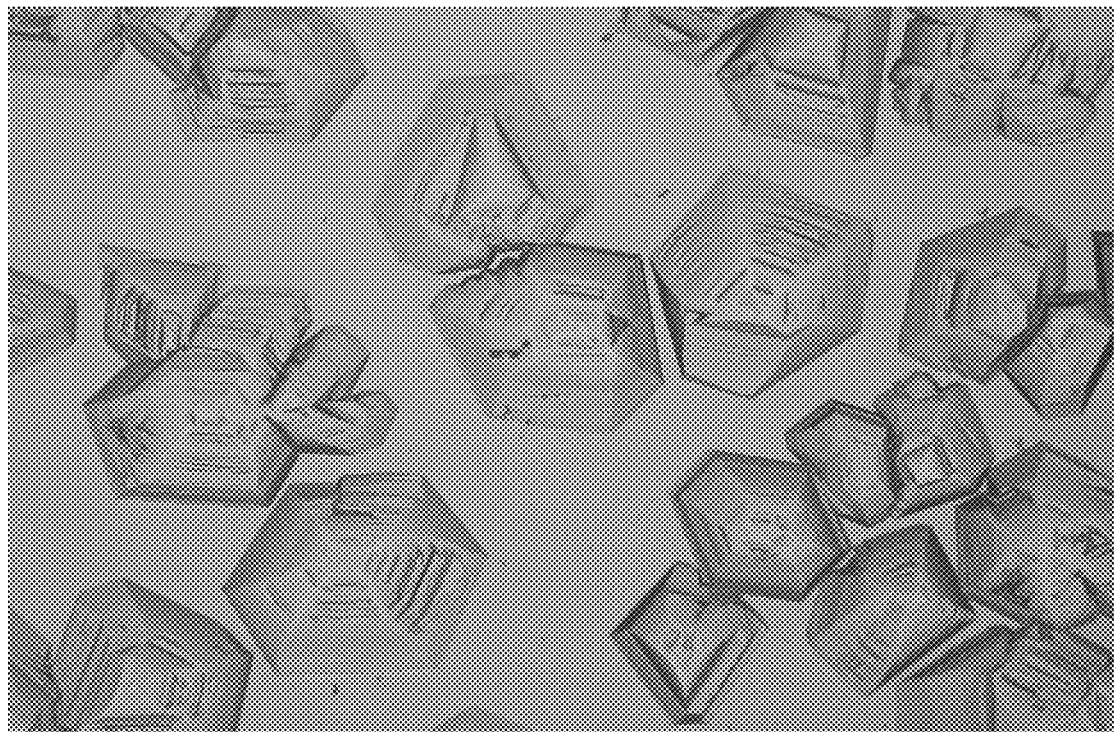
FIG. 16A is a partially enlarged photograph illustrating an example of the substrate contact area according to Embodiment 2.
Figure 16B:
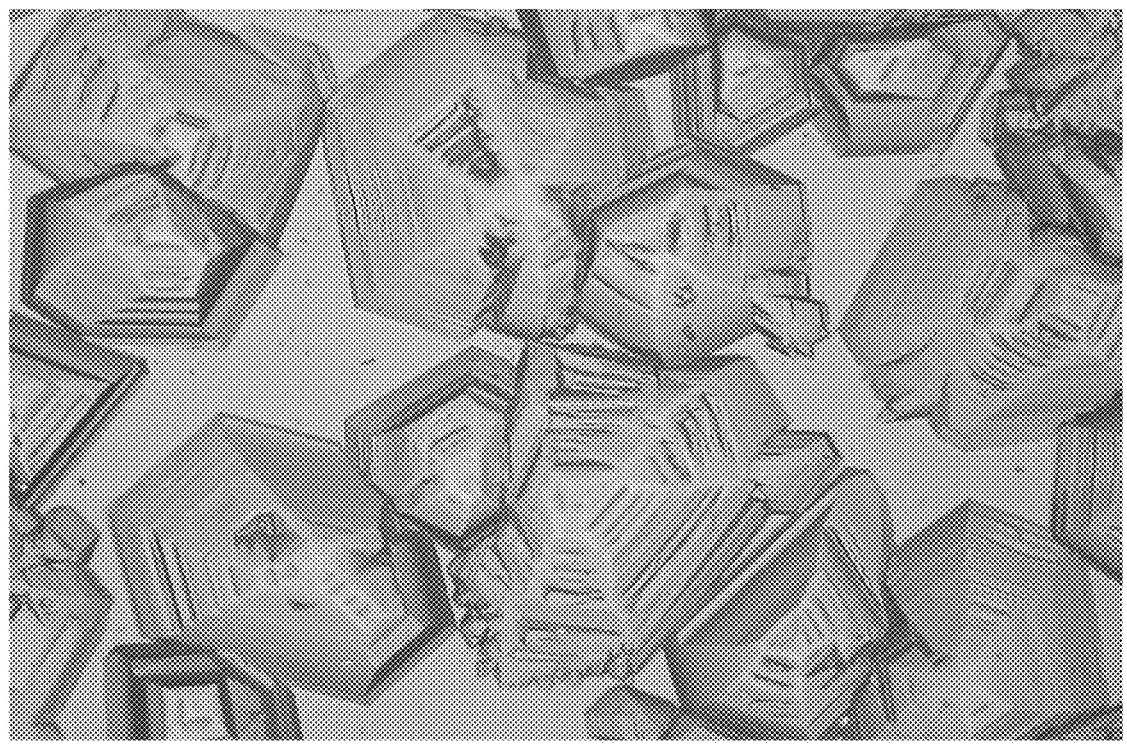
FIG. 16B is a partially enlarged photograph illustrating another example of the substrate contact area according to Embodiment 2.

The irregularities 2401a and 2402a in the substrate contact areas A3 on the stage 2401 and the head 2402 may be formed by, for example, after having performed blast treatment on the substrate contact areas A3, performing surface polishing treatment, respectively. In this case, on the surfaces of the substrate contact areas A3 on the stage 2401 and the head 2402, for example, irregularities with an arithmetic average roughness of approximately 10 µm are formed, as illustrated in FIG. 15A. Alternatively, the irregularities 2401a and 2402a in the substrate contact areas A3 on the stage 2401 and the head 2402 may be formed by, for example, performing silica coating on the substrate contact areas A3, respectively. In this case, on the surfaces of the substrate contact areas A3 on the stage 2401 and the head 2402, for example, irregularities with an arithmetic average roughness of approximately 5 µm are formed, as illustrated in FIG. 15B. Further, the irregularities 2401a and 2402a in the substrate contact areas A3 on the stage 2401 and the head 2402 may be formed by, for example, etching the substrate contact areas A3, respectively. In this case, on the surfaces of the substrate contact areas A3 on the stage 2401 and the head 2402, for example, irregularities with an arithmetic average roughness of approximately 1.59 µm as illustrated in FIG. 16A or irregularities with an arithmetic average roughness of approximately 2.63 µm as illustrated in FIG. 16B are formed.

It is preferable to separate the substrates 301 and 302 from the stage 2401 and the head 2402 by filling the back sides of the substrates 301 and 302 with gas and thereby increasing pressure within gaps between portions of the substrates 301 and 302 facing inner side portions of the substrate contact areas A3 and the stage 2401 and the head 2402, respectively. Because of this requirement, it is preferable that the irregularities 2401a and 2402a in the substrate contact areas A3 be formed at least on the inner side in the substrate contact areas A3 excluding peripheral portions thereof.

Figure 13B:
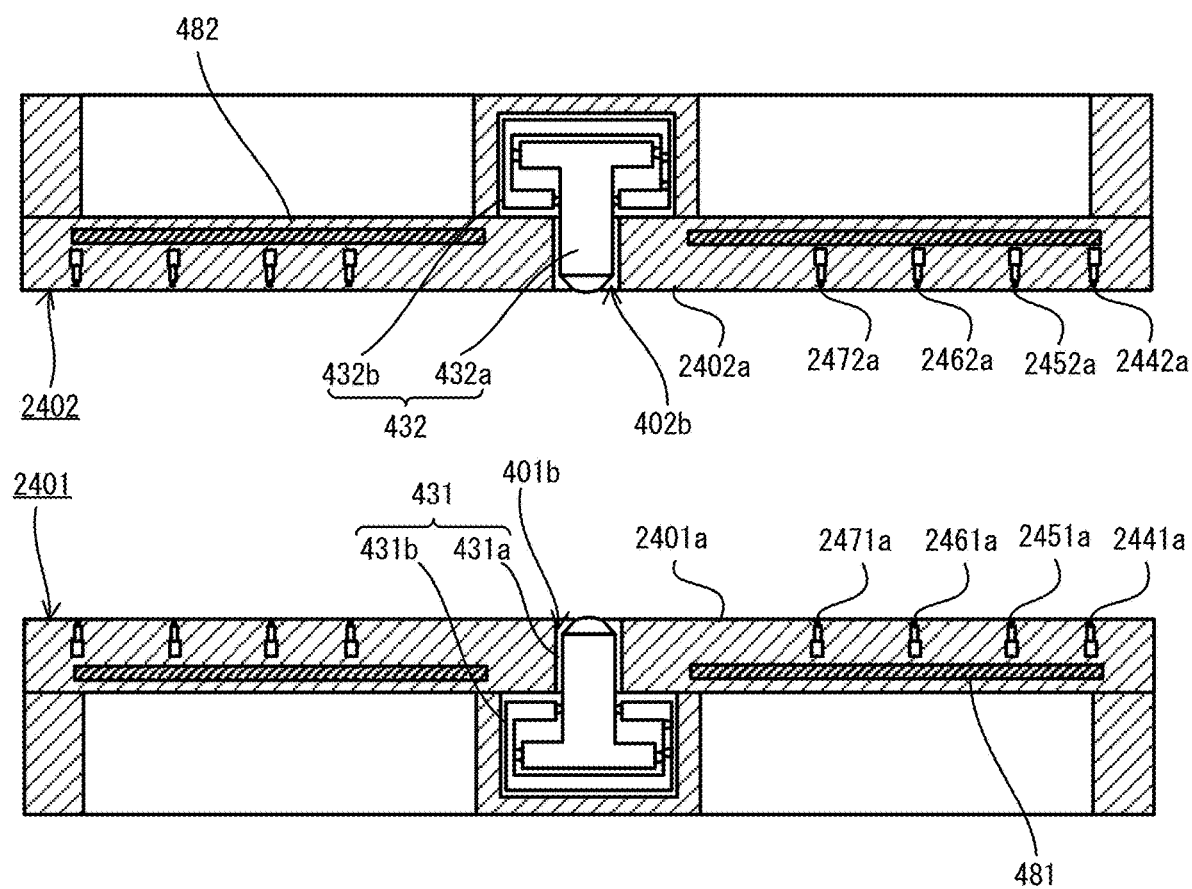
FIG. 13B is a schematic cross-sectional view of the stage and the head according to Embodiment 2.
Figure 14:
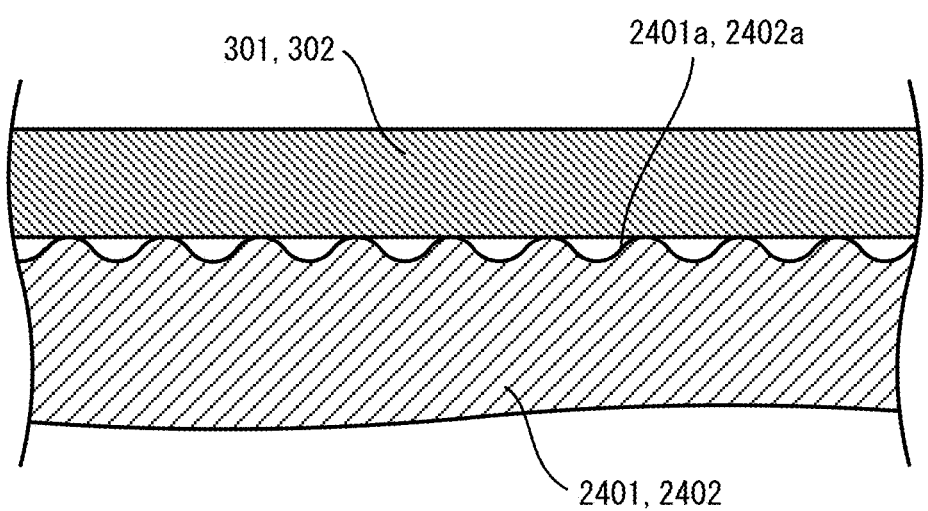
FIG. 14 is an enlarged cross-sectional view of a vicinity of surfaces of the stage and the head according to Embodiment 2.

On the stage 2401 and the head 2402, suction holes 2441a, 2451a, 2461a, 2471a, 2442a, 2452a, 2462a, and 2472a for sucking and holding the substrates 301 and 302, a first pressing mechanism 431 that presses a central portion of the substrate 301, and a second pressing mechanism 432 that presses a central portion of the substrate 302 are disposed, as illustrated in FIGS. 13A and 13B. The suction holes 2441a and 2442a are first holders that hold peripheral portions of the substrates 301 and 302, respectively. The suction holes 2451a, 2461a, and 2471a and the suction holes 2452a, 2462a, and 2472a are second holders that hold portions on the inner side of peripheral portions of the substrates 301 and 302, respectively. The suction holes 2441a, 2451a, 2461a, and 2471a can be individually switched between a state of sucking and holding the substrate 301 and a state of not sucking and holding the substrate 301. The suction holes 2442a, 2452a, 2462a, and 2472a can be also individually switched between a state of sucking and holding the substrate 302 and a state of not sucking and holding the substrate 302. Each of the suction holes 2441a, 2451a, 2461a, 2471a, 2442a, 2452a, 2462a, and 2472a is connected to, for example, a vacuum pump (not illustrated) via an individual exhaust pipe (not illustrated).

Figure 17:
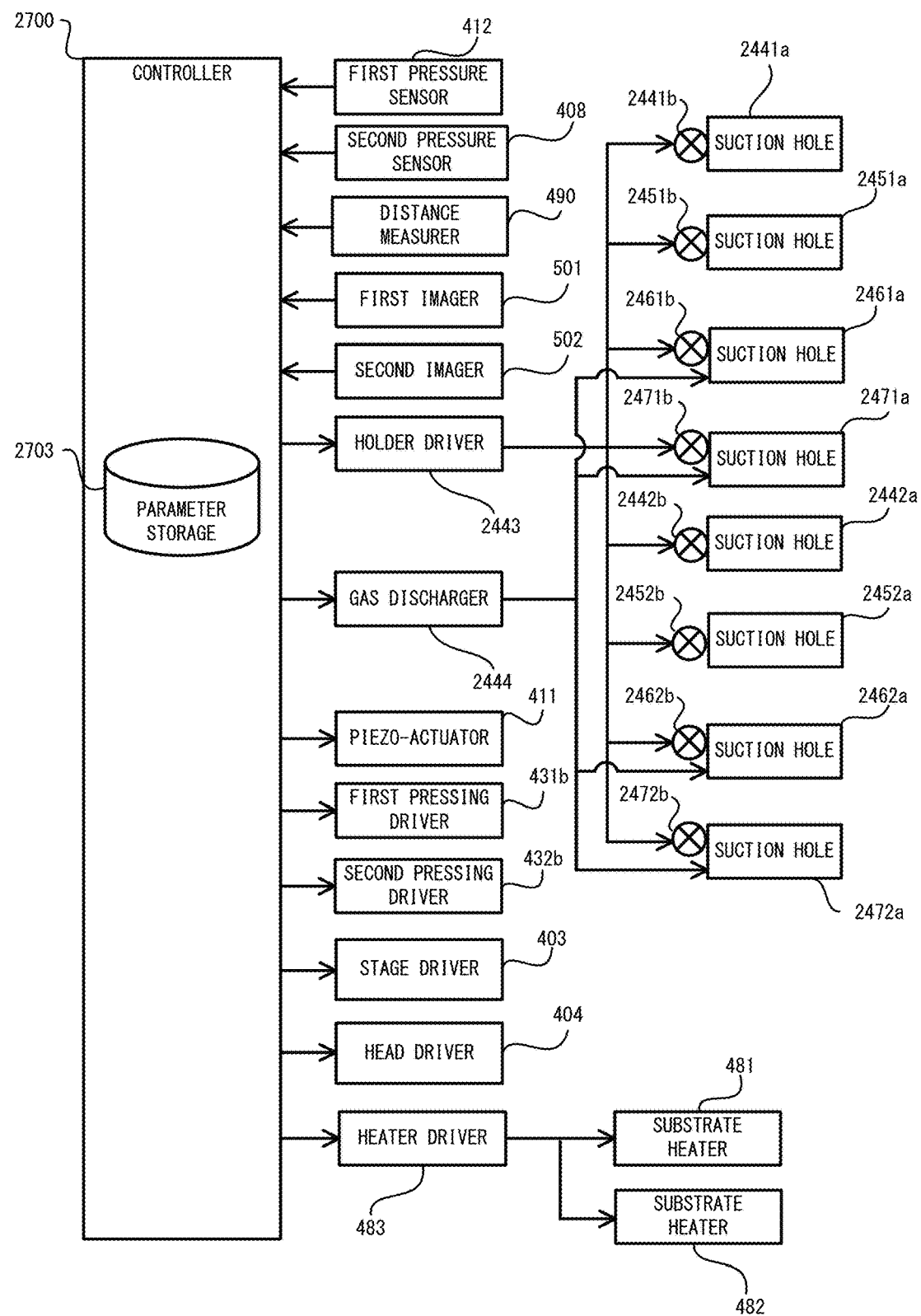
FIG. 17 is a block diagram illustrating a configuration of a portion of the substrate bonding device according to Embodiment 2.

The substrate bonding device according to the present embodiment includes open/close valves 2441b, 2451b, 2461b, 2471b, 2442b, 2452b, 2462b, and 2472b each of which is interposed in one of the exhaust pipes and is independently opened or closed and a holder driver 2443, as illustrated in FIG. 17. For example, it is assumed that the open/close valves 2441b and 2451b have been brought to the closed state and the open/close valves 2461b and 2471b have been brought to the open state. In this case, the substrate 301 is brought to a state in which the substrate 301 is not sucked and held at the suction holes 2441a and 2451a and the substrate 301 is sucked and held only at the suction holes 2461a and 2471a. The holder driver 2443 is connected to the open/close valves 2441b, 2451b, 2461b, 2471b, 2442b, 2452b, 2462b, and 2472b. The holder driver 2443 individually brings the respective open/close valves 2441b, 2451b, 2461b, 2471b, 2442b, 2452b, 2462b, and 2472b to the open state or the closed state, based on a control signal input from a controller 2700.

Further, the substrate bonding device according to the present embodiment includes a gas discharger 2444 that discharges gas into interspaces between the substrate contact areas A3 on the stage 2401 and the head 2402 and the substrates 301 and 302 illustrated in FIG. 13A while the stage 2401 and the head 2402 support the substrates 301 and 302, respectively. The gas discharger 2444 includes a compressor (not illustrated), supply pipes (not illustrated) through which gas is individually supplied from the compressor to the suction holes 2461a, 2471a, 2462a, and 2472a, and open/close valves (not illustrated) each of which is interposed in one of the supply pipes. The gas discharger 2444 discharges gas into interspaces between the substrate contact areas A3 on the stage 2401 and the head 2402 and the substrates 301 and 302 through the suction holes 2461a and 2471a and the suction holes 2462a and 2472a by bringing the open/close valves to the open state, respectively. In this processing, the gas discharger 2444 discharges, for example, a gas containing ions, such as He ions, or a gas containing water.

Returning to FIG. 17, the controller 2700 has a similar configuration to the configuration of the controller 700 described in Embodiment 1. A parameter storage 2703 stores the afore-described misalignment amount threshold values Δxth, Δyth, and Δθth. The controller 2700, as with the controller 700, converts measurement signals that are input from first pressure sensors 412, a second pressure sensor 408, and a distance measurer 490 to measurement information and acquires the measurement information. The controller 2700 also converts captured image signals that are input from a first imager 501 and a second imager 502 to captured image information and acquires the captured image information. Further, the controller 2700, by reading programs stored in an auxiliary storage into a main storage and executing the programs, respectively outputs control signals to the holder driver 2443, the gas discharger 2444, piezo-actuators 411, a first pressing driver 431b, a second pressing driver 432b, a heater driver 483, a stage driver 403, and a head driver 404.

Next, a substrate bonding process that the substrate bonding device according to the present embodiment performs will be described. Since the substrate bonding process according to the present embodiment is similar to the substrate bonding process that was described in Embodiment 1, using FIG. 7, the description will be made referring to FIG. 7. In processing in step S4 in FIG. 7, the substrate bonding device according to the present embodiment, while making the suction holes 2441a and 2451a on the peripheral side on the stage 2401 illustrated in FIG. 13A suck and hold the substrate 301, releases sucking and holding of the substrate 301 by the suction holes 2461a and 2471a on the central portion side on the stage 2401. In this processing, the controller 2700 controls the holder driver 2443 to bring the open/close valves 2441b and 2451b illustrated in FIG. 17 to the open state and the open/close valves 2461b and 2471b illustrated in FIG. 17 to the closed state. The substrate bonding device 2100 makes a first pressing rod 431a press the central portion of the substrate 301 illustrated in FIG. 13A to the substrate 302 side while making the suction holes 2441a and 2451a suck and hold a peripheral portion 301s of the substrate 301. In addition, the substrate bonding device 2100, while making the suction holes 2442a and 2452a on the peripheral side on the head 2402 suck and hold the substrate 302, releases sucking and holding of the substrate 302 by the suction holes 2462a and 2472a on the central portion side on the head 2402. In this processing, the controller 2700 controls the holder driver 2443 to bring the open/close valves 2442b and 2452b illustrated in FIG. 17 to the open state and the open/close valves 2462b and 2472b illustrated in FIG. 17 to the closed state. The substrate bonding device 2100 makes a second pressing rod 432a press the central portion of the substrate 302 illustrated in FIG. 13A to the substrate 301 side while making the suction holes 2442a and 2452a suck and hold a peripheral portion 302s of the substrate 302.

Figure 7:
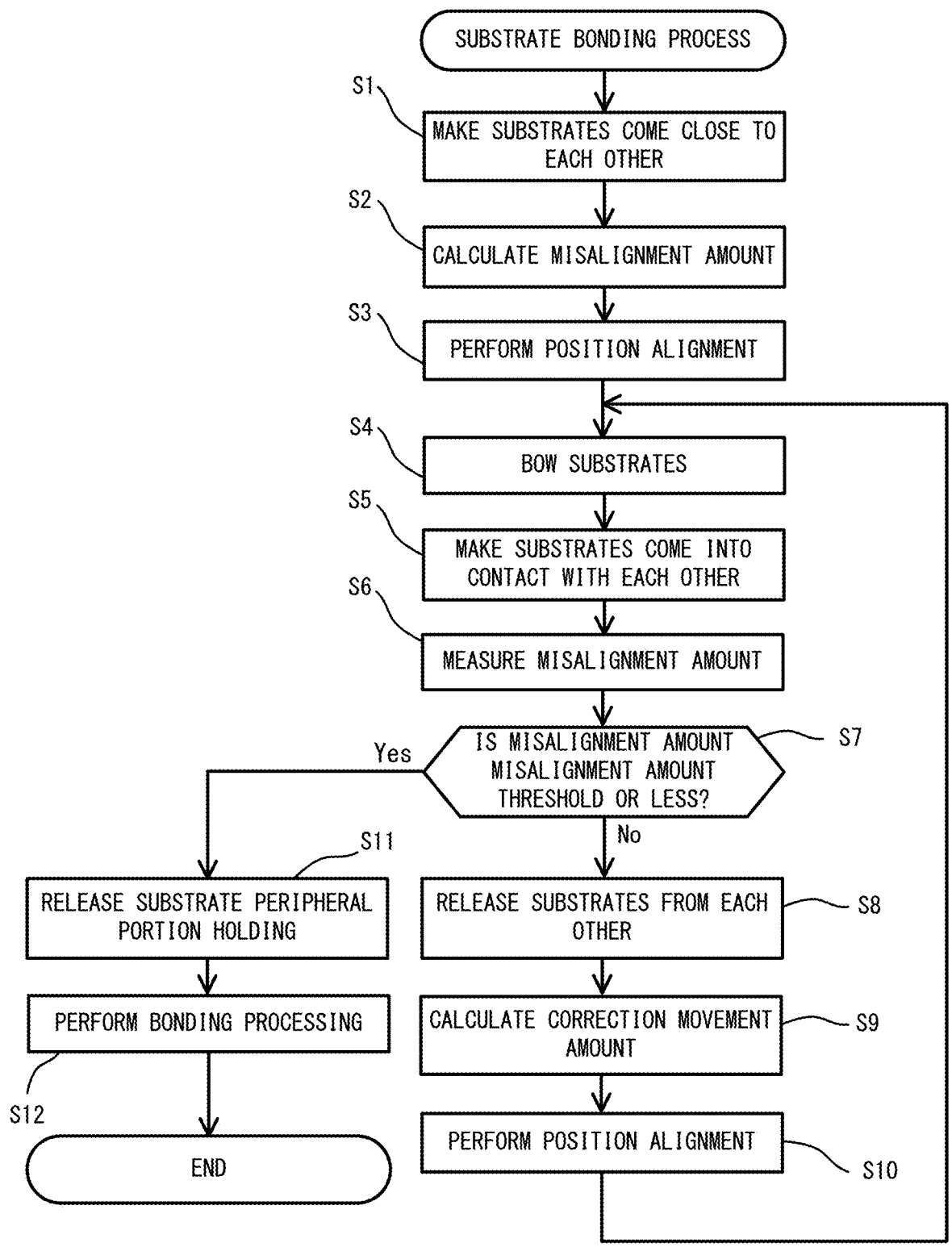
FIG. 7 is a flowchart illustrating a flow of a substrate bonding process that the substrate bonding device according to Embodiment 1 performs.

In processing in step S12 in FIG. 7, the substrate bonding device according to the present embodiment makes the gas discharger 2444 discharge gas into interspaces between the substrate contact areas A3 on the stage 2401 and the head 2402 and the substrates 301 and 302 illustrated in FIG. 13A, respectively. In this processing, when the peripheral portions of the substrates 301 and 302 are made to come into contact with each other, the controller 2700 controls the gas discharger 2444 to discharge gas into interspaces between the substrate contact areas A3 on the stage 2401 and the head 2402 and the substrates 301 and 302, respectively. Specifically, the controller 2700 controls the holder driver 2443 to bring the open/close valves 2441b, 2442b, 2451b, and 2452b illustrated in FIG. 17 to the closed state and, in conjunction therewith, controls the gas discharger 2444 in such a way that the open/close valves of the gas discharger 2444 are brought to the open state. This configuration enables occurrence of sticking of the peripheral portions of the substrates 301 and 302 on the stage 2401 and the head 2402 to be suppressed, respectively.

As described in the foregoing, according to the substrate bonding device according to the present embodiment, irregularities are formed in the substrate contact areas A3 that face the substrates 301 and 302 while the stage 2401 and the head 2402 support the substrates 301 and 302, respectively. Since, when the peripheral portion 301s of the substrate 301 is made to come into contact with the peripheral portion 302s of the substrate 302, this configuration enables sticking of the peripheral portion of the substrate 301 on the stage 2401 to be suppressed, it is possible to avoid bonding of the substrates 301 and 302 to each other while distortion is generated in the substrate 301 and to bond the substrates 301 and 302 to each other without distortion, over the whole surfaces, and with high positional precision.

Arithmetic average roughness of the surface of the substrate contact area A3 of each of the stage 2401 and the head 2402 according to the present embodiment is in a range of 0.1 μm to 1 mm. When, for example, misalignment measurement is performed using the first imager 501 and the second imager 502 from the opposite side of the stage 2401 to the substrate 301 side thereof, this configuration enables light emitted from the first imager 501 and the second imager 502 to be prevented from being scattered by the stage 2401. Therefore, it becomes possible to perform alignment between the substrate 301 and the substrate 302 with high precision.

It is now assumed that a surface of the stage 2401 supporting the substrate 301 is as smooth as a mirror surface or has large contact area. In this case, when the gas discharger 2444 discharges gas from the suction holes 2461a and 2471a and thereby separates the substrate 301 from the stage 2401, there is a possibility that the gas passes only a portion of the interspace between the substrate 301 and the stage 2401 and flows out. In such a situation, there is a possibility that pressure in a gap between the inner side portion of the substrate 301 facing the substrate contact area A3 and the stage 2401 does not increase, gas does not flow to other portions in the substrate contact area A3 within the interspace between the substrate 301 and the stage 2401, the substrate 301 is stuck on the stage 2401, and the substrate 301 cannot be separated from the stage 2401 smoothly. The same applies to a case where the substrate 302 is separated from the head 2402.

In contrast, the stage 2401 and the head 2402 according to the present embodiment have irregularities formed in the substrate contact areas A3 thereon. Since, when the gas discharger 2444 discharges gas from the suction holes 2461a and 2471a and thereby separates the substrate 301 from the stage 2401, this configuration enables the interspace between the substrate 301 and the stage 2401 to be filled with gas and pressure in the gap between a portion of the substrate 301 facing the substrate contact area A3 and the stage 2401 to be increased, it becomes easier to separate the substrate 301 from the stage 2401. Therefore, sticking of the substrate 301 on the stage 2401 is suppressed, and it is possible to separate the substrate 301 from the stage 2401 smoothly. The same applies to a case where the substrate 302 is separated from the head 2402.

The gas discharger 2444 according to the present embodiment discharges a gas containing ions or a gas containing water. When the stage 2401 and the head 2402 are electrostatically charged, the amounts of electrostatic charge on the stage 2401 and the head 2402 are decreased by destaticizing effect of the gas discharged from the gas discharger 2444. Therefore, sticking of the substrates 301 and 302 on the stage 2401 and the head 2402 caused by the stage 2401 and the head 2402 being electrostatically charged is suppressed, respectively.

Embodiment 3

Figure 18A:
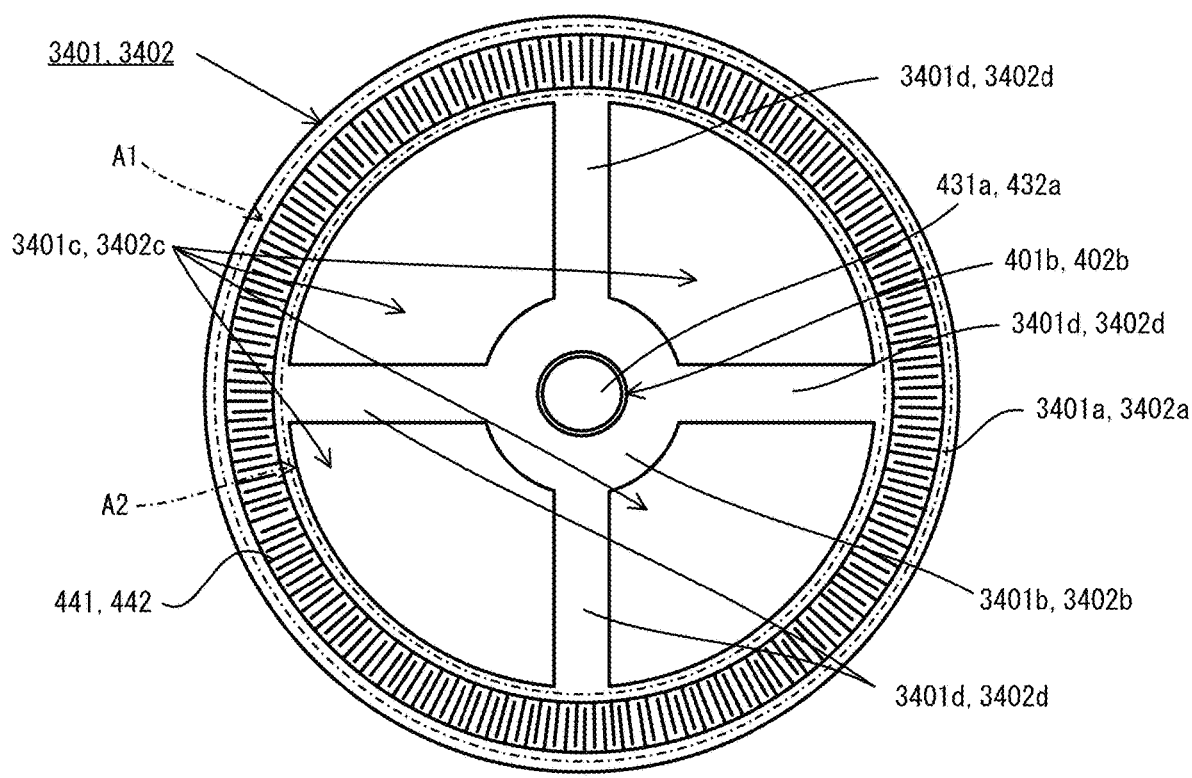
FIG. 18A is a schematic plan view of a stage and a head according to Embodiment 3.
Figure 18B:
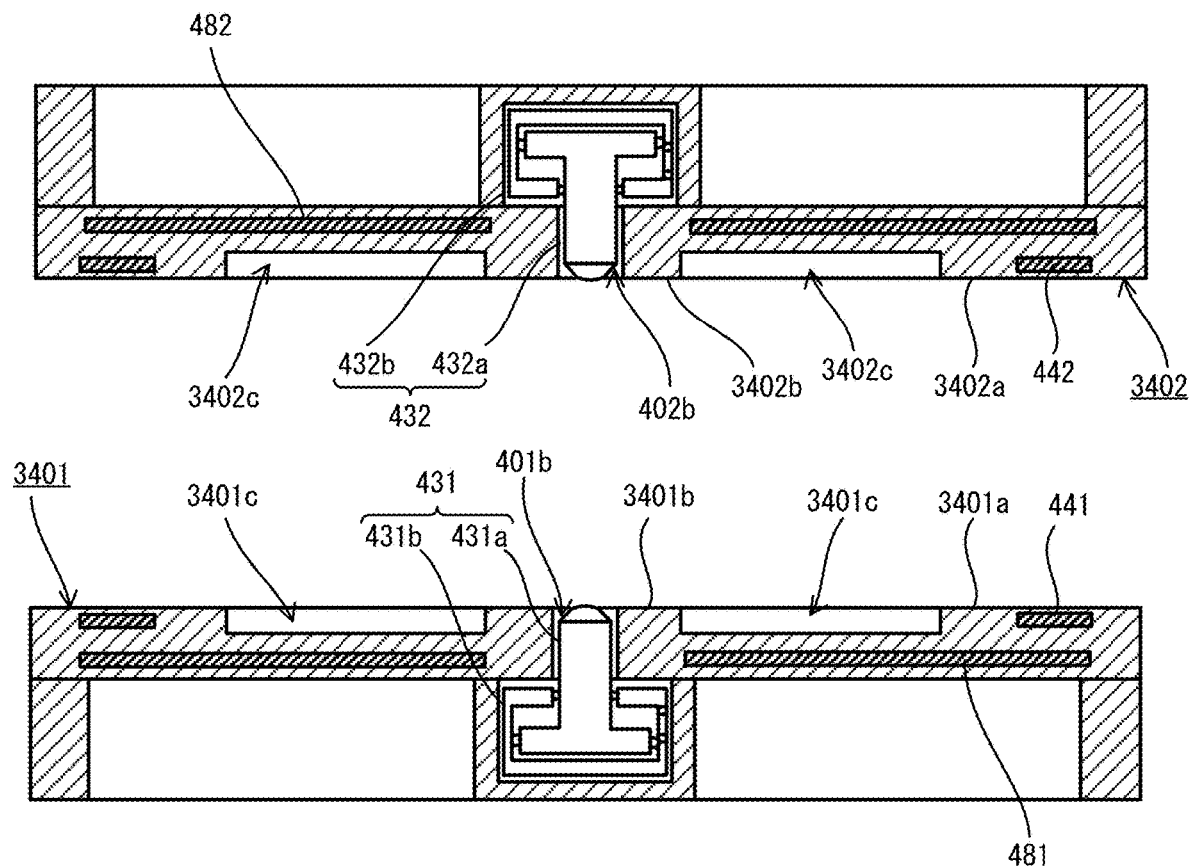
FIG. 18B is a schematic cross-sectional view of the stage and the head according to Embodiment 3.

A substrate bonding device according to the present embodiment is similar to the substrate bonding device 100 that was described in Embodiment 1 and is illustrated in FIG. 1. However, the substrate bonding device according to the present embodiment differs from the substrate bonding device 100 that was described in Embodiment 1 in that the substrate bonding device includes, instead of the stage 401 and the head 402 according to Embodiment 1, a stage 3401 and a head 3402 as illustrated in FIGS. 18A and 18B. Note that, in the following description, constituent components of the substrate bonding device according to the present embodiment that are the same as those of the substrate bonding device 100 according to Embodiment 1 will be described using the same reference signs as the reference signs illustrated in FIGS. 1 to 9C. In addition, in FIGS. 18A and 18B, the same reference signs as those in FIGS. 3A and 3B are assigned to the same constituent components as those in Embodiment 1.

The stage 3401 and the head 3402 are arranged to face each other in the vertical direction in a vacuum chamber 200. The stage 3401 and the head 3402 have recesses 3401c and 3402c that are disposed in second areas A2 located on the inner side of first areas A1, respectively, as illustrated in FIG. 18A. The first areas A1 are equivalent to areas on the stage 3401 and the head 3402 that face peripheral portions of substrates 301 and 302 while the substrates 301 and 302 are supported by the stage 3401 and the head 3402, respectively. The stage 3401 and the head 3402 have four ribs 3401d and four ribs 3402d that extend from central portions of the recesses 3401c and 3402c to the peripheries of the recesses 3401c and 3402c and come into contact with the substrates 301 and 302, respectively. The four ribs 3401d and the four ribs 3402d extend from the central portion of the recesses 3401c and 3402c in a radial manner. Peripheral portions 3401a and 3402a of the stage 3401 and the head 3402, inner side parts 3401b and 3402b that are equivalent to outer peripheral portions of through-holes 401b and 402b located on the inner side in the second areas A2 on the stage 3401 and the head 3402, and the ribs 3401d and 3402d support the substrates 301 and 302, respectively.

In the substrate bonding device according to the present embodiment, as with Embodiment 1, electrostatic chucks 441 and 442 are arranged in the first areas A1 on the stage 3401 and the head 3402, respectively. To holder driver 443 according to the present embodiment, only the electrostatic chucks 441 and 442 are connected. The holder driver 443 applies voltage to the respective electrostatic chucks 441 and 442 and thereby drives the electrostatic chucks 441 and 442, based on a control signal input from a controller 700. Note that the substrate bonding process according to the present embodiment is similar to the substrate bonding process that was described in Embodiment 1, using FIG. 7.

As described in the foregoing, according to the substrate bonding device according to the present embodiment, the stage 3401 and the head 3402 have the four ribs 3401d and the four ribs 3402d that extend from the central portions of the recesses 3401c and 3402c disposed in the second areas A2 on the stage 3401 and the head 3402 to the peripheries of the recesses 3401c and 3402c and come into contact with the substrates 301 and 302, respectively. Since this configuration enables contact areas between the substrates 301 and 302 and the stage 3401 and the head 3402 to be reduced, sticking of the substrates 301 and 302 on the stage 3401 and the head 3402 is suppressed when holding of the substrates 301 and 302 by the stage 3401 and the head 3402 are released, respectively. Therefore, it is possible to avoid bonding of the substrates 301 and 302 to each other while distortion is generated in the substrates 301 and 302 and to bond the substrates 301 and 302 to each other without distortion, over the whole surfaces, and with high positional precision.

Figure 19:
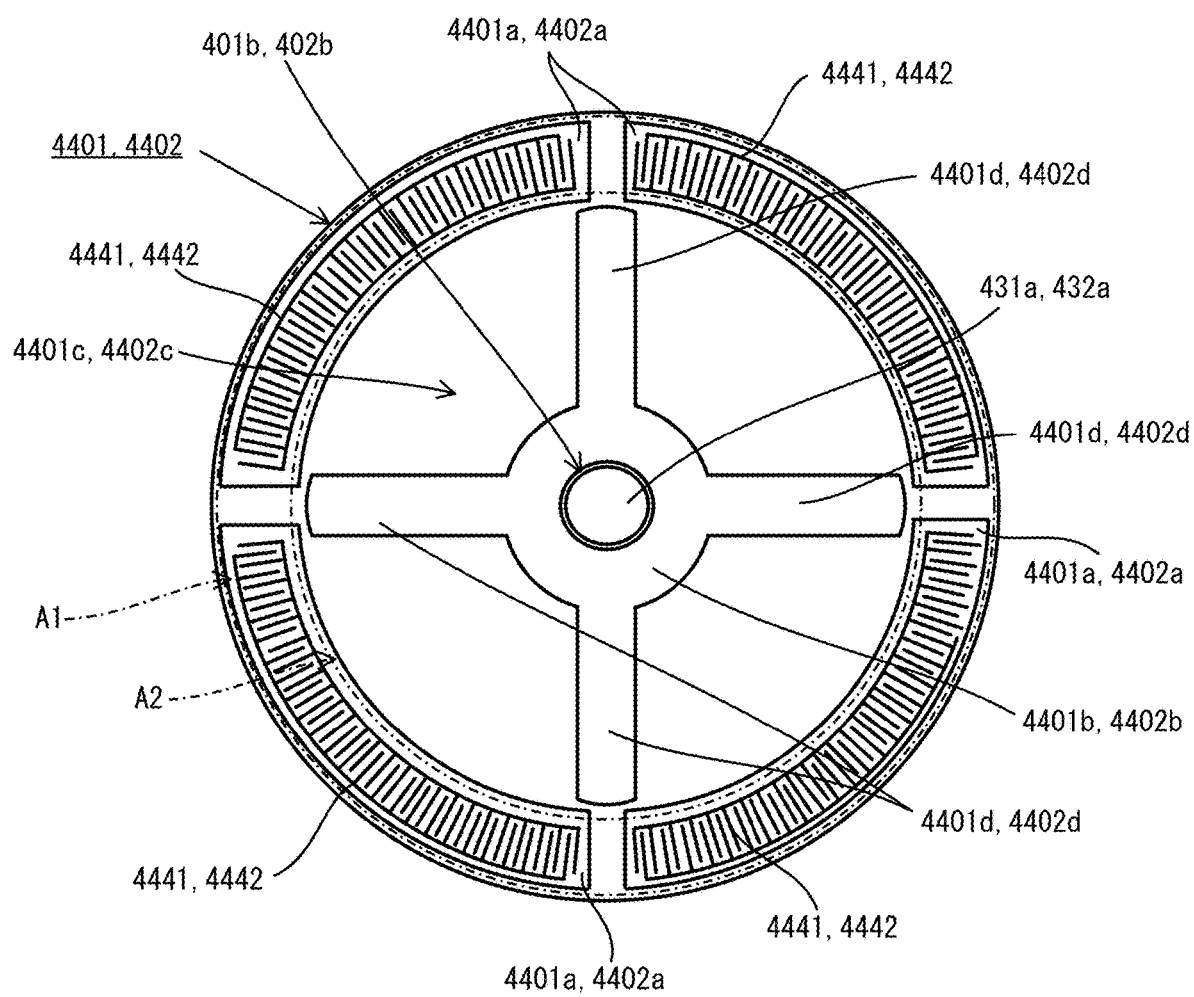
FIG. 19 is a schematic plan view of a stage and a head according to a variation.

Although the respective embodiments of the present disclosure were described above, the present disclosure is not limited to the configurations of the afore-described respective embodiments. For example, the substrate bonding device may be a device including a stage 4401 and a head 4402 as illustrated in FIG. 19. Note that, in FIG. 19, the same reference signs as those in FIG. 18A are assigned to the same constituent components as those in Embodiment 3. The stage 4401 and the head 4402 have four circular-arc-shaped first protrusions 4401a and four circular-arc-shaped first protrusions 4402a that are arranged along annular first areas A1 and four long plate-shaped ribs 4401d and four long plate-shaped ribs 4402d that are disposed in the interiors of recesses 4401c and 4402c that are formed in second areas A2 located on the inner side of the first areas A1, respectively, as illustrated in FIG. 19. On the first protrusions 4401a and 4402a, electrostatic chucks 4441 and 4442 are arranged, respectively. The stage 4401 and the head 4402 also have, on the outer peripheries of through-holes 401b and 402b thereof, annular second protrusions 4401b and 4402b from which one end portions on the through-holes 401b side and the through-hole 402b side in the longitudinal directions of the four ribs 4401d and the four ribs 4402d continue, respectively. At interspaces between the other end portions in the longitudinal directions of the four ribs 4401d and the four ribs 4402d and the first protrusions 4401a and 4402a, gaps are formed, respectively. Heights in the thickness direction of the stage 4401 and the head 4402 of the first protrusions 4401a and 4402a, the ribs 4401d and 4402d, and the second protrusions 4401b and 4402b are configured to be equal to one another, respectively. When the stage 4401 and the head 4402 are made to support substrates 301 and 302 while a first pressing rod 431a and a second pressing rod 432a are retracted into the stage 4401 and the head 4402, this configuration causes the first protrusions 4401a and 4402a, the ribs 4401d and 4402d, and the second protrusions 4401b and 4402b to come into contact with the substrates 301 and 302, respectively.

According to the present configuration, small contact areas between the substrates 301 and 302 and the first protrusions 4401a and 4402a in the first area A1 enables sticking of peripheral portions of the substrates 301 and 302 on the stage 4401 and the head 4402 to be suppressed when holding of the peripheral portions of the substrates 301 and 302 by the stage 4401 and the head 4402 are released, respectively. Therefore, it is possible to avoid bonding of the substrates 301 and 302 to each other while distortion is generated in the substrates 301 and 302 and to bond the substrates 301 and 302 to each other without distortion, over the whole surfaces, and with high positional precision.

Figure 20A:
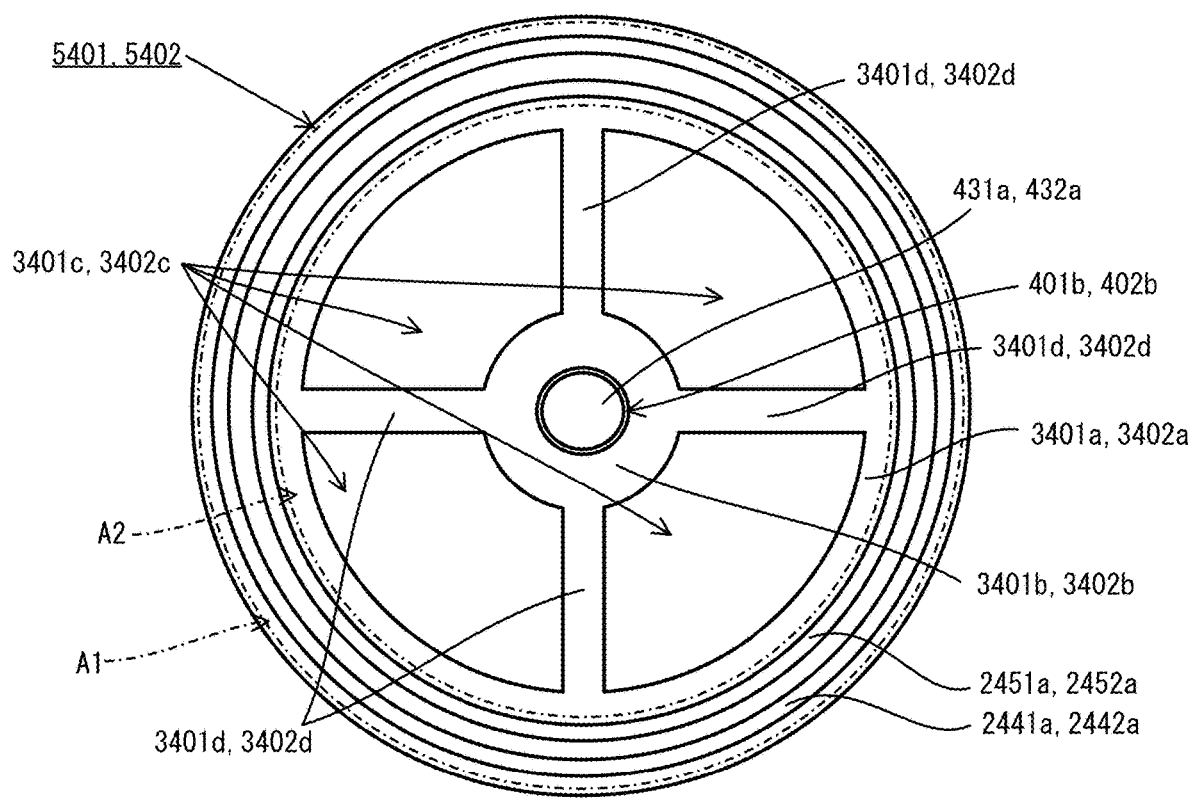
FIG. 20A is a schematic plan view of a stage and a head according to another variation.
Figure 20B:
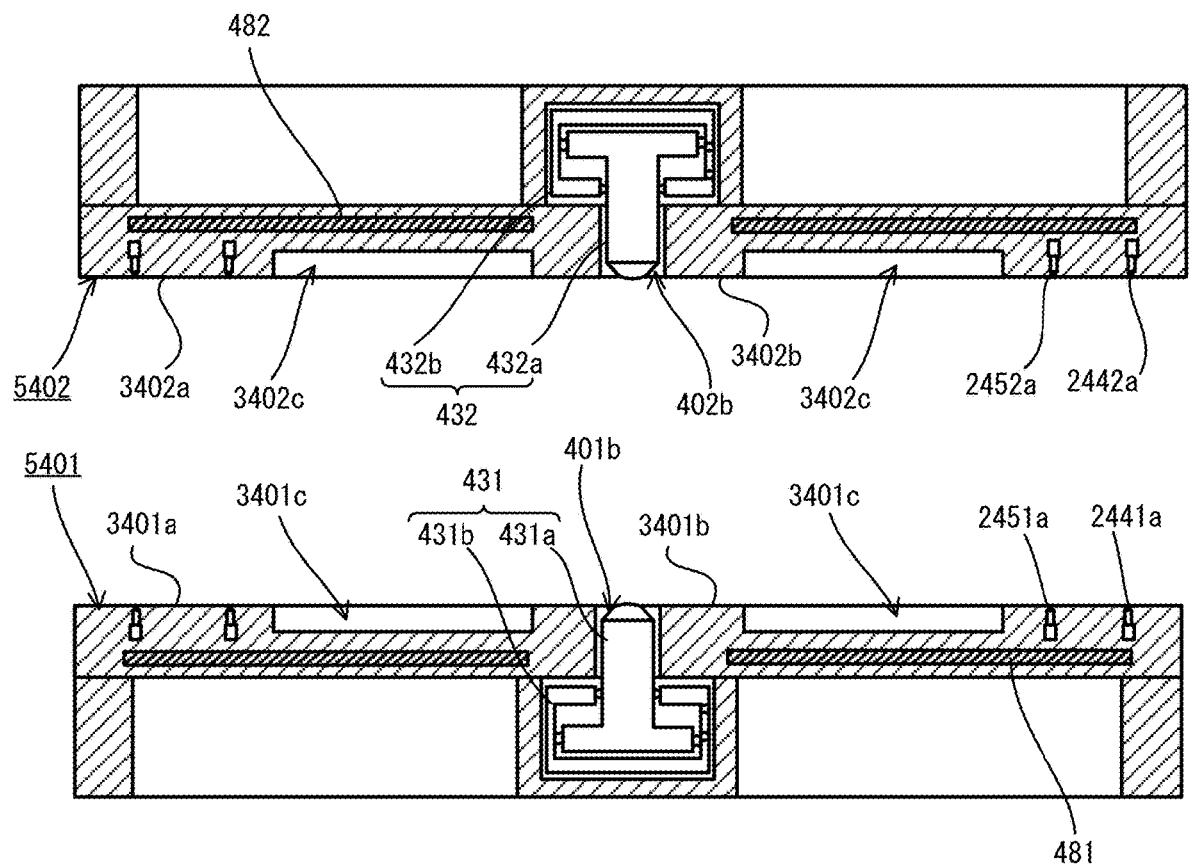
FIG. 20B is a schematic cross-sectional view of the stage and the head according to the another variation.

The substrate bonding device may be a device including, for example, a stage 5401 and a head 5402 as illustrated in FIGS. 20A and 20B in the substrate bonding device 2100 according to Embodiment 2. Note that, in FIGS. 20A and 20B, the same reference signs as those in FIGS. 13A and 13B and FIGS. 18A and 18B are assigned to the same constituent components as those in Embodiments 2 and 3. On the stage 5401 and the head 5402, suction holes 2441a and 2451a and suction holes 2442a and 2452a are arranged in first areas A1 and recesses 3401c and 3402c and long plate-shaped ribs 3401d and 3402d are disposed in second areas A2, respectively. The suction holes 2441a and 2451a can be individually switched between a state of sucking and holding a substrate 301 and a state of not sucking and holding the substrate 301. The suction holes 2442a and 2452a can be also individually switched between a state of sucking and holding a substrate 302 and a state of not sucking and holding the substrate 302. Each of the suction holes 2441a, 2451a, 2442a, and 2452a is connected to, for example, a vacuum pump (not illustrated) via an individual exhaust pipe (not illustrated).

Since this configuration, as with Embodiment 3, also enables contact areas between the substrates 301 and 302 and the stage 5401 and the head 5402 to be reduced, sticking of the substrates 301 and 302 on the stage 5401 and the head 5402 are suppressed when holding of the substrates 301 and 302 by the stage 5401 and the head 5402 are released, respectively. Therefore, it is possible to avoid bonding of the substrates 301 and 302 to each other while distortion is generated in the substrates 301 and 302 and to bond the substrates 301 and 302 to each other without distortion, over the whole surfaces, and with high positional precision.

Figure 21:
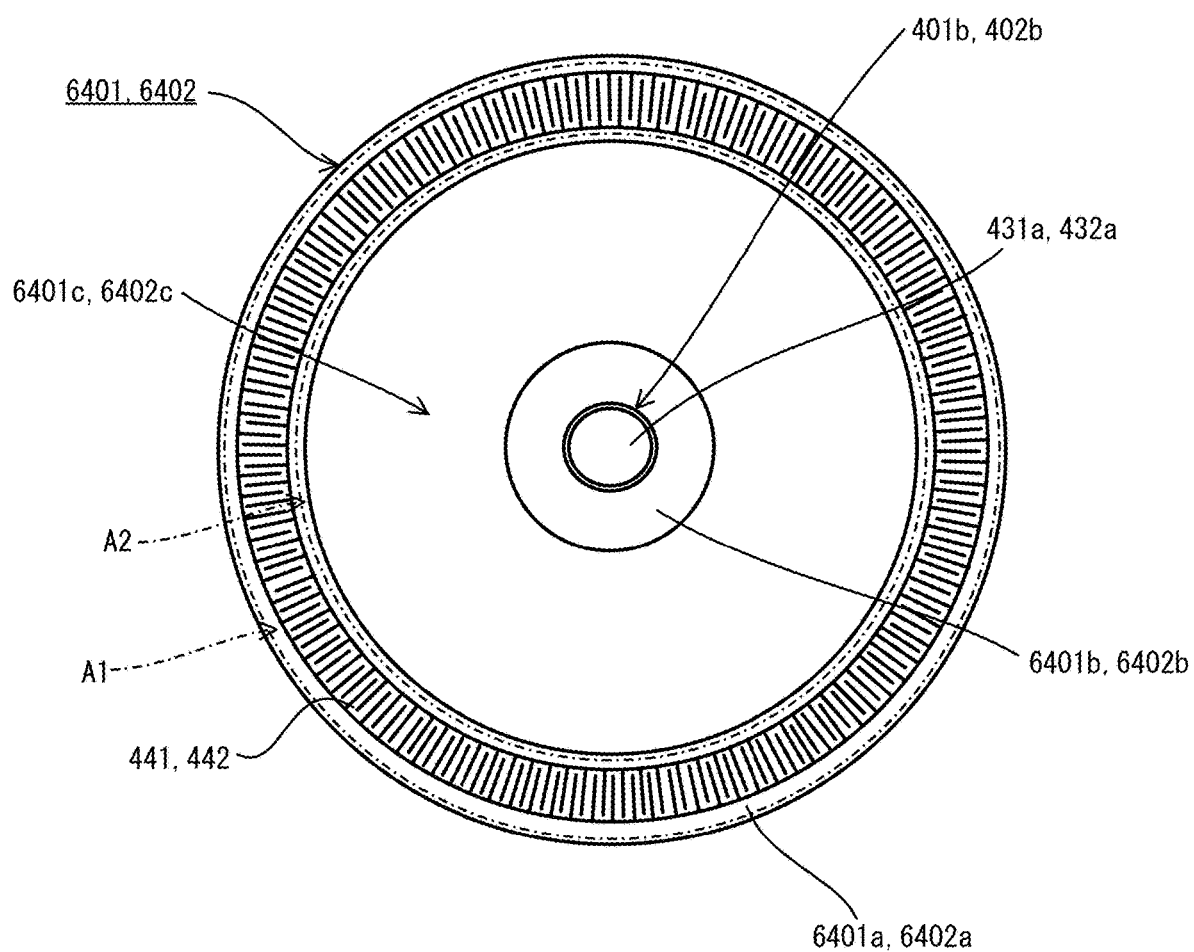
FIG. 21 is a schematic plan view of a stage and a head according to still another variation.

In Embodiment 1, an example in which the electrostatic chucks 441 and 442 are arranged in the first areas A1 on the stage 401 and the head 402 and the electrostatic chucks 451 and 461 and the electrostatic chucks 452 and 462 are arranged in the second area A2 on the stage 401 and the head 402, respectively, was described. However, without being limited to the above, for example as illustrated in FIG. 21, the substrate bonding device according to the present disclosure may be a device in which, in second areas A2 on a stage 6401 and a head 6402, annular recesses 6401c and 6402c are disposed, respectively, and no electrostatic chuck is arranged. Note that, in FIG. 21, the same reference signs as those in FIG. 3A are assigned to the same constituent components as those in Embodiment 1. The stage 6401 and the head 6402 have peripheral portions 6401a and 6402a including first areas A1 and inner side parts 6401b and 6402b that are equivalent to outer peripheral portions of through-holes 401b and 402b on the inner side in the second areas A2, respectively. In this case, when the stage 6401 and the head 6402 are made to support substrates 301 and 302 while a first pressing rod 431a and a second pressing rod 432a are retracted into the stage 6401 and the head 6402, the peripheral portions 6401a and 6402a and the inner side parts 6401b and 6402b come into contact with the substrates 301 and 302, respectively.

Figure 22A:
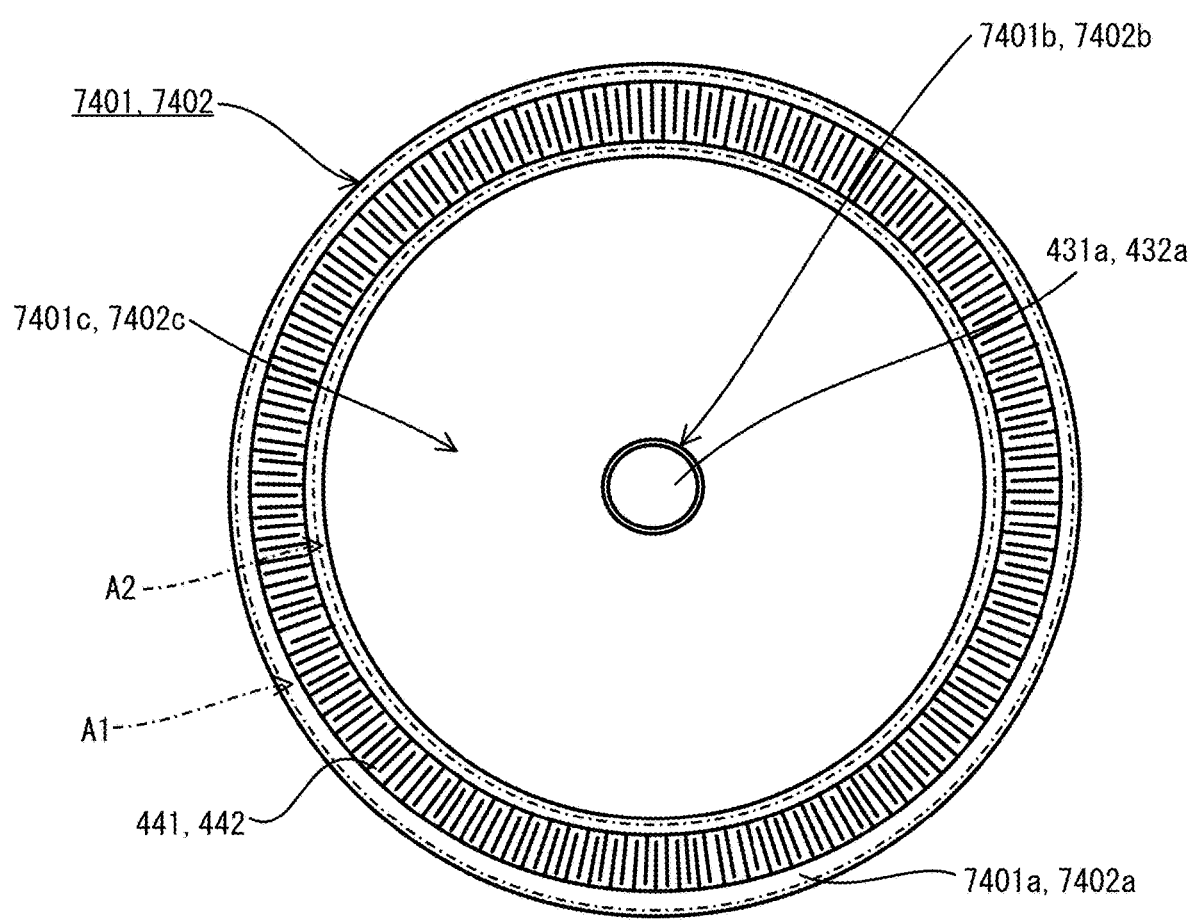
FIG. 22A is a schematic plan view of a stage and a head according to still another variation.
Figure 22B:
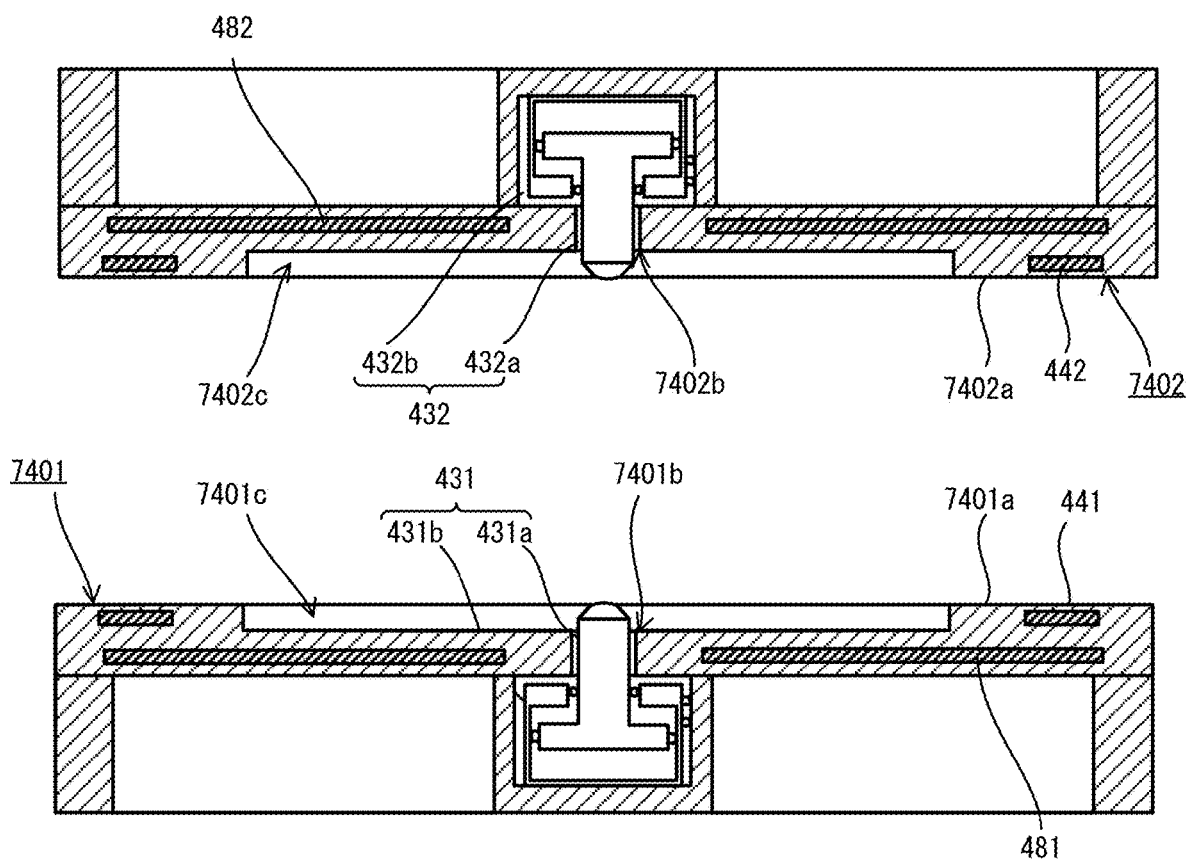
FIG. 22B is a schematic cross-sectional view of the stage and the head according to the still another variation.

Alternatively, as illustrated in FIGS. 22A and 22B, the substrate bonding device according to the present disclosure may be a device in which recesses 7401c and 7402c having a circular shape in plan view are disposed in second areas A2 on a stage 7401 and a head 7402 and through-holes 7401b and 7402b are opened at the bottoms of the recesses 7401c and 7402c, respectively. In this case, when the stage 7401 and the head 7402 are made to support substrates 301 and 302 while a first pressing rod 431a and a second pressing rod 432a are retracted into the stage 7401 and the head 7402, only peripheral portions 7401a and 7402a on the stage 7401 and the head 7402 come into contact with the substrates 301 and 302, respectively.

The present configuration enables contact areas between the substrates 301 and 302 and the stage 7401 and the head 7402 to be smaller than a case of the stage 3401 and the head 3402 according to Embodiment 3, respectively. Therefore, sticking of the substrates 301 and 302 on the stage 7401 and the head 7402 are suppressed when holding of the substrates 301 and 302 by the stage 7401 and the head 7402 is released, respectively.

In Embodiment 1, an example in which the pluralities of electrode elements 441c and 442c and the pluralities of electrode elements 441d and 442d are arranged in such a manner as to be alternately lined up along the circumferential direction of the stage 401 and the head 402 in the first areas A1, respectively, was described. However, without being limited to the above, a pluralities of electrode elements may be arranged in such a manner as to be alternately lined up along radial directions of the stage 401 and the head 402 in the first areas A1. Alternatively, a pluralities of electrode elements may be arranged in such a manner as to be alternately lined up along an arbitrary one direction orthogonal to the thickness direction of the stage 401 and the head 402 in the first areas A1. In Embodiment 1, an example in which the pluralities of electrode elements 451c and 452c and the pluralities of electrode elements 451d and 452d are arranged in such a manner as to be alternately lined up along the circumferential directions of the boundaries between the first areas A1 and the second areas A2 in the second areas A2, respectively, was described. However, without being limited to the above, a pluralities of electrode elements may be arranged in such a manner as to be alternately lined up along radial directions of the stage 401 and the head 402 in the second areas A2 or may be arranged in such a manner as to be alternately lined up along an arbitrary one direction orthogonal to the thickness direction of the stage 401 and the head 402. Alternatively, a pluralities of electrode elements may be arranged in such a manner as to be alternately lined up along the circumferential directions of the stage 401 and the head 402 in the whole second areas A2.

Although, in Embodiments 1 and 3, an example in which the substrates 301 and 302 are bonded to each other in a vacuum was described, the present disclosure is not limited to the example and the substrate bonding device according to the present disclosure may be a device that bonds the substrates 301 and 302 to each other under atmospheric pressure or may be a device that bonds the substrates 301 and 302 to each other under an atmosphere filled with an arbitrary gas.

Although, in the respective embodiments, an example in which the head 402, 2402, or 3402 moves in the vertical direction with respect to the stage 401, 2401, or 3401 was described, the present disclosure is not limited to the example and the substrate bonding device according to the present disclosure may be a device in which, for example, the stage 401, 2401, or 3401 moves in the vertical direction with respect to the head 402, 2402, or 3402.

Although, in the respective embodiments, an example in which both substrates 301 and 302 are bowed was described, the present disclosure is not limited to the example and it may be configured such that, for example, only either of the substrates 301 and 302 is bowed. For example, the substrate bonding device according to the present disclosure may be a device in which the first pressing mechanism 431 is disposed only to the stage 401, 2401, or 3401 and no pressing mechanism is disposed to the head 402, 2402, or 3402. In this case, only the substrate 301 can be bowed. Alternatively, the substrate bonding device according to the present disclosure may be a device in which the second pressing mechanism 432 is disposed only to the head 402, 2402, or 3402 and no pressing mechanism is disposed to the stage 401, 2401, or 3401. In this case, only the substrate 302 can be bowed. In addition, a substrate bonding device according to the present disclosure may be a device in which a gas discharger (not illustrated) is disposed to the stage 401, 2401, or 3401 and the substrate 301 is bowed by discharging gas into an interspace between the stage 401, 2401, or 3401 and the substrate 301 while a peripheral portion of the substrate 301 is held by the stage 401, 2401, or 3401. Alternatively, the substrate bonding device according to the present disclosure may be a device in which a gas discharger (not illustrated) is disposed to the head 402, 2402, or 3402 and the substrate 302 is bowed by discharging gas into an interspace between the head 402, 2402, or 3402 and the substrate 302 while a peripheral portion of the substrate 302 is held by the head 402, 2402, or 3402.

The substrate bonding device according to the present disclosure may be a device that includes a neutralizer (not illustrated) that, in Embodiment 1 or 3, electrically neutralizes the stage 401 or 3401 or the head 402 or 3402 by supplying the stage 401 or 3401 or the head 402 or 3402 with electrons or ions. In this case, the controller 700 is only required to control the neutralizer to supply the stage 401 or 3401 or the head 402 or 3402 with electrons or ions after a state in which the stage 401 or 3401 and the head 402 or 3402 hold the substrates 301 and 302 has transitioned to a state in which neither the stage 401 or 3401 nor the head 402 or 3402 support the substrates 301 and 302, respectively. The neutralizer may be a neutralizer that includes a metal filament (not illustrated) formed of a metal, such as tungsten, and a filament power source (not illustrated) flowing current to the metal filament and supplies the stage 401 or 3401 or the head 402 or 3402 with electrons. Alternatively, the neutralizer may be, for example, an ion source that generates negative ions electrically or an ion source that generates negative ions, using ultraviolet rays.

According to the present configuration, electrons or ions supplied from the neutralizer to the stage 401 or 3401 or the head 402 or 3402 enable the amount of electrostatic charge on the stage 401 or 3401 or the head 402 or 3402 to be reduced. Therefore, sticking of the substrates 301 and 302 on the stage 401 or 3401 and the head 402 or 3402 caused by the stage 401 or 3401 and the head 402 or 3402 being electrostatically charged is suppressed, respectively.

Although, in the embodiments, an example in which each of the first imager 501 and the second imager 502 is a so-called reflection-type imager that includes an imaging element and a coaxial illumination system was described, the configurations of the first imager and the second imager are not limited to the example. For example, the first imager and the second imager may respectively have a so-called transmission-type configuration that includes an imaging element (not illustrated) and a light source (not illustrated) arranged at positions facing each other with the substrates 301 and 302 interposed therebetween in the thickness direction of the substrates 301 and 302 and that captures images of the alignment marks MK1a, MK2a, MK1b, and MK2b with the imaging element and the light source arranged in such a way that the imaging element receives light emitted by the light source and transmitted through the substrates 301 and 302.

This application claims the benefit of Japanese Patent Application No. 2018-135801, filed on Jul. 19, 2018, the entire disclosure of which is incorporated by reference herein.

INDUSTRIAL APPLICABILITY

The present disclosure is suitable for manufacturing of, for example, CMOS image sensors, memories, arithmetic elements, or MEMSes.

REFERENCE SIGNS LIST 100, 2100 Substrate bonding device
200 Vacuum chamber
201 Vacuum pump
202 Exhaust pipe
203 Exhaust valve
301, 302 Substrate
401, 2401, 3401, 4401, 5401, 6401, 7401 Stage
401a Upper surface
401b, 402b, 7401b, 7402b Through-hole
402, 2402, 3402, 4402, 5402, 6402, 7402 Head
402a Under surface
403 Stage driver
404 Head driver
405 XY direction driver
406 Ascent/descent driver
407 Rotation driver
408 Second pressure sensor
411 Piezo-actuator
412 First pressure sensor
431 First pressing mechanism
431a First pressing rod
431b First pressing driver
432 Second pressing mechanism
432a Second pressing rod
432b Second pressing driver
441, 442, 451, 452, 461, 462 Electrostatic chuck
443, 2443 Holder driver
481, 482 Substrate heater
483 Heater driver
490 Distance measurer
500 Position measurer
501 First imager
502 Second imager
503 Window
504, 505 Mirror 700, 2700 Controller
703, 2703 Parameter storage
2401a, 2402a Irregularity
2441a, 2442a, 2451a, 2452a, 2461a, 2462a, 2471a, 2472a Suction hole
2441b, 2442b, 2451b, 2452b, 2461b, 2462b, 2471b, 2472b Open/close valve
2444 Gas discharger
3401a, 3402a, 6401a, 6402a, 7401a, 7402a Peripheral portion
3401b, 3402b, 6401b, 6402b Inner side part
3401c, 3402c, 6401c, 6402c, 7401c, 7402c Recess
3401d, 3402d, 4401d, 4402d Rib
4401a, 4402a First protrusion
4401b, 4402b Second protrusion
A1 First area
A2 Second area
A3 Substrate contact area
AC Contact area
GAa, GAb Captured image
MK1a, MK1b, MK2a, MK2b Alignment mark
S1 Space

The invention claimed is:

1. A substrate bonding device bonding a first substrate and a second substrate to each other, the substrate bonding device comprising:
a first support base supporting the first substrate;
a second support base supporting the second substrate while a bonding surface of the second substrate is made to face a bonding surface of the first substrate;
a first holder disposed on the first support base and holding a peripheral portion of the first substrate;
a holder driver driving the first holder;
a controller controlling the holder driver to release holding of a peripheral portion of the first substrate by the first holder when a bonding surface of the first substrate and a bonding surface of the second substrate are bonded together over the whole surfaces by making a peripheral portion of the first substrate come into contact with a peripheral portion of the second substrate while the first substrate is supported by the first support base with the first substrate bowed in such a way that a central portion of the first substrate protrudes to the second substrate side with respect to a peripheral portion of the first substrate and a central portion of the bonding surface of the first substrate and a central portion of the bonding surface of the second substrate are in contact with each other; and
an imager arranged on an opposite side of the first support base to a side of the first support base on which the first substrate is supported or an opposite side of the second support base to a side of the second support base on which the second substrate is supported, wherein
at least one of the first support or the second support having the at least a portion made of glass having translucency,
on the first substrate, a first alignment mark is disposed,
on the second substrate, a second alignment mark is disposed, and
the imager captures an image of the first alignment mark and the second alignment mark through either the first support or the second support having the at least a portion made of glass having translucency, and
the first support base has an irregularity formed at least on an inner side of a substrate contact area, the substrate contact area facing the first substrate while the first support base supports the first substrate.

2. The substrate bonding device according to claim 1, wherein arithmetic average roughness of a surface in the substrate contact area is in a range of 0.1 µm to 1 mm.

3. A substrate bonding device bonding a first substrate and a second substrate to each other, the substrate bonding device comprising:
a first support base supporting the first substrate;
a second support base supporting the second substrate while a bonding surface of the second substrate is made to face a bonding surface of the first substrate;
a first holder disposed on the first support base and holding a peripheral portion of the first substrate;
a holder driver driving the first holder;
a controller controlling the holder driver to release holding of a peripheral portion of the first substrate by the first holder when a bonding surface of the first substrate and a bonding surface of the second substrate are bonded together over the whole surfaces by making a peripheral portion of the first substrate come into contact with a peripheral portion of the second substrate while the first substrate is supported by the first support base with the first substrate bowed in such a way that a central portion of the first substrate protrudes to the second substrate side with respect to a peripheral portion of the first substrate and a central portion of the bonding surface of the first substrate and a central portion of the bonding surface of the second substrate are in contact with each other; and
an imager arranged on an opposite side of the first support base to a side of the first support base on which the first substrate is supported or an opposite side of the second support base to a side of the second support base on which the second substrate is supported, wherein
at least one of the first support or the second support having the at least a portion made of glass having translucency,
on the first substrate, a first alignment mark is disposed,
on the second substrate, a second alignment mark is disposed, and
the imager captures an image of the first alignment mark and the second alignment mark through either the first support or the second support having the at least a portion made of glass having translucency, and
the first support base has at least one rib extending from a central portion of a recess, the recess being disposed in a second area located on an inner side of a first area facing a peripheral portion of the first substrate, to a periphery of the recess on the first support base and coming into contact with the first substrate.

4. The substrate bonding device according to claim 3, wherein
the at least one rib exists in plural, and
a plurality of ribs extends from a central portion of the recess in a radial manner.

* * * * *